US011894095B2

(12) United States Patent
Satoh et al.

(10) Patent No.: US 11,894,095 B2
(45) Date of Patent: Feb. 6, 2024

(54) SEMICONDUCTOR MEMORY DEVICE

(71) Applicant: KIOXIA CORPORATION, Tokyo (JP)

(72) Inventors: Yuji Satoh, Kawasaki Kanagawa (JP); Hiromitsu Komai, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 9 days.

(21) Appl. No.: 17/685,230

(22) Filed: Mar. 2, 2022

(65) Prior Publication Data

US 2023/0087689 A1 Mar. 23, 2023

(30) Foreign Application Priority Data

Sep. 22, 2021 (JP) ................................. 2021-154184

(51) Int. Cl.
*G11C 7/06* (2006.01)
*G11C 7/10* (2006.01)

(52) U.S. Cl.
CPC .............. *G11C 7/065* (2013.01); *G11C 7/106* (2013.01); *G11C 7/109* (2013.01); *G11C 7/1063* (2013.01); *G11C 7/1087* (2013.01)

(58) Field of Classification Search
CPC ....... G11C 7/065; G11C 7/106; G11C 7/1063; G11C 7/1087; G11C 7/109; G11C 7/067; G11C 2207/005; G11C 7/1039; G11C 16/26
USPC .................................................... 365/185.21
See application file for complete search history.

(56) References Cited

U.S. PATENT DOCUMENTS

| 6,590,802 B2 | 7/2003 | Nii |
| 7,869,261 B2* | 1/2011 | Ozawa .................. G11C 11/412 |
| | | 365/154 |
| 8,363,486 B2 | 1/2013 | Abiko |
| 9,082,640 B2 | 7/2015 | Nakatsuka et al. |
| 9,704,572 B2 | 7/2017 | Chen et al. |
| 10,049,751 B2 | 8/2018 | Komai |
| 10,103,716 B2 | 10/2018 | Takagiwa |
| 2014/0286104 A1 | 9/2014 | Kamata et al. |
| 2016/0260487 A1* | 9/2016 | Maejima ................ G11C 16/16 |

(Continued)

FOREIGN PATENT DOCUMENTS

| JP | 2011-129176 A | 6/2011 |
| JP | 2018-029301 A | 2/2018 |

(Continued)

*Primary Examiner* — Amir Zarabian
(74) *Attorney, Agent, or Firm* — Kim & Stewart LLP

(57) ABSTRACT

A semiconductor memory device includes a plurality of data latch circuits that are used for input and output of data between a sense amplifier circuit and an input/output circuit, and a data bus that is connected to the plurality of data latch circuits. Each of the data latch circuits includes an inverter circuit that temporarily stores data input and output between the sense amplifier circuit and the input/output circuit, and at least three MOS transistors between the inverter circuit and the data bus. The at least three MOS transistors may be multiple N-channel type MOS transistors and at least one P-channel type MOS transistor connected in parallel between the inverter circuit and the data bus, or at least one N-channel type MOS transistor and multiple P-channel type MOS transistors connected in parallel between the inverter circuit and the data bus.

20 Claims, 21 Drawing Sheets

(56) References Cited

U.S. PATENT DOCUMENTS

2019/0043561 A1\* 2/2019 Li .................... G11C 11/412
2019/0057764 A1\* 2/2019 Riedel ................ G16H 20/17
2021/0217479 A1\* 7/2021 Oh .................... G11C 7/1006

FOREIGN PATENT DOCUMENTS

| TW | I521522 B | 2/2016 |
|---|---|---|
| TW | 201905920 A | 2/2019 |
| WO | 2016031023 A1 | 3/2016 |

\* cited by examiner

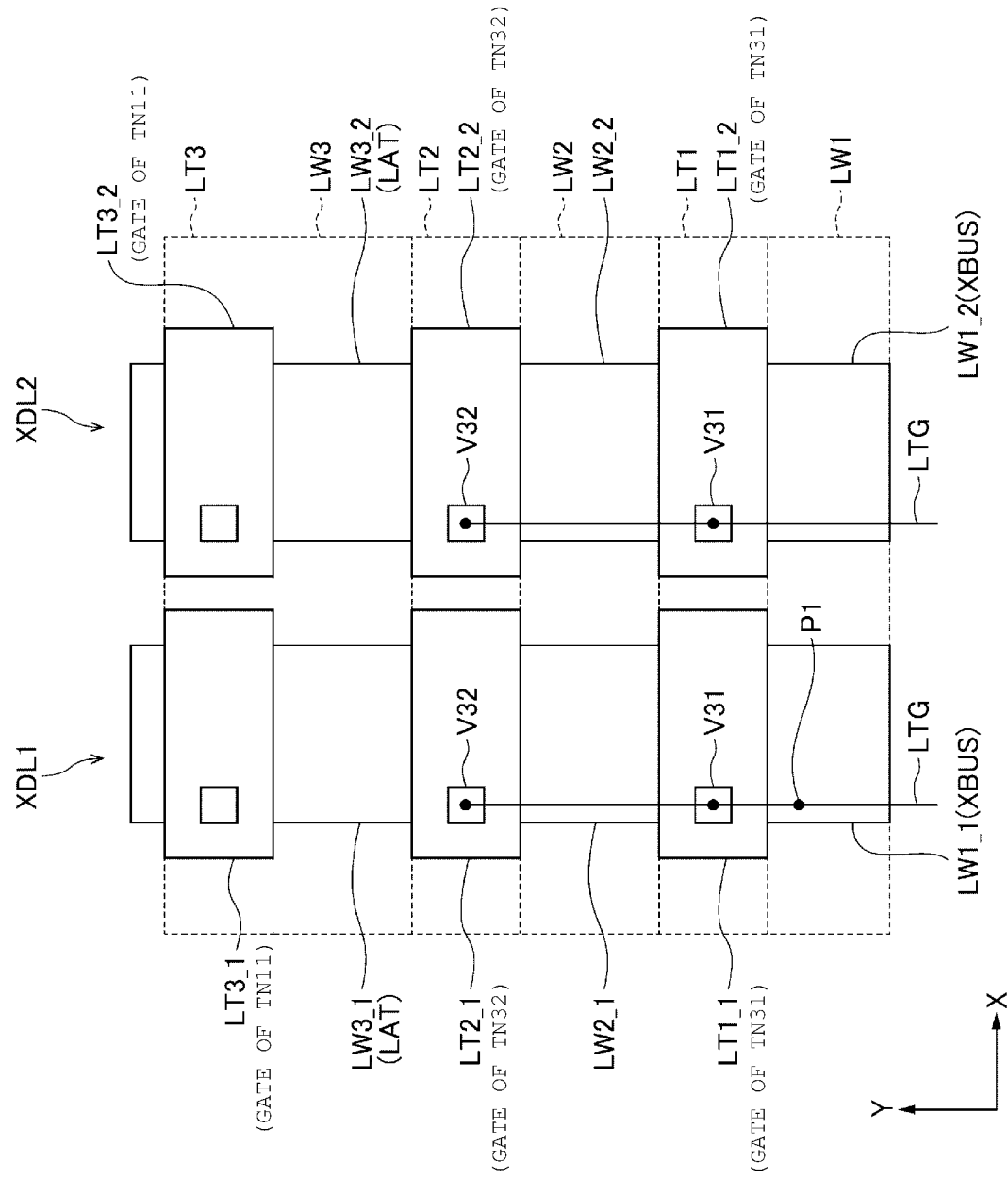

SEMICONDUCTOR MEMORY DEVICE

CROSS-REFERENCE TO RELATED APPLICATION

This application is based upon and claims the benefit of priority from Japanese Patent Application No. 2021-154184, filed Sep. 22, 2021, the entire contents of which are incorporated herein by reference.

FIELD

Embodiments described herein relate generally to a semiconductor memory device.

BACKGROUND

A semiconductor memory device of related art includes a plurality of data latch circuits used for input and output of data between a sense amplifier and an input/output circuit. The plurality of data latch circuits are connected to each other via data wiring. The data output from the sense amplifier is temporarily stored in the data latch circuits, and then output from the input/output circuit via the data wiring.

DESCRIPTION OF THE DRAWINGS

FIG. 8A is a diagram schematically showing a planar structure around the data latch circuit of the semiconductor memory device according to a first example of the embodiment.

DETAILED DESCRIPTION

Figure 1:
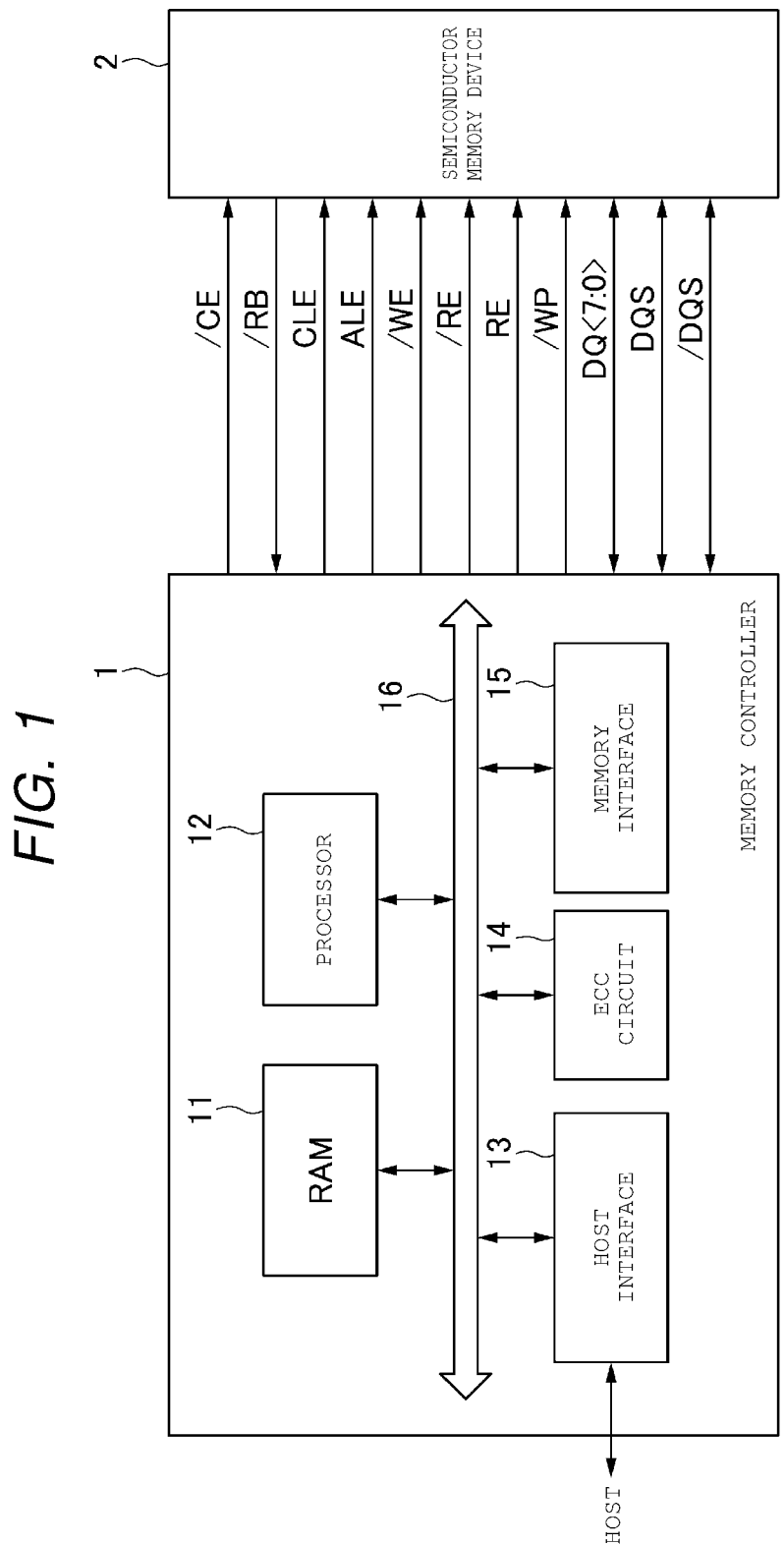
FIG. 1 is a block diagram showing a schematic configuration of a memory system according to an embodiment.

Embodiments provide a semiconductor memory device capable of enhancing the robustness of input and output of data.

In general, according to one embodiment, a semiconductor memory device includes a plurality of data latch circuits that are used for input and output of data between a sense amplifier circuit and an input/output circuit, and a data wiring that is connected to the plurality of data latch circuits. Each of data latch circuits includes a data storage unit that temporarily stores data input and output between the sense amplifier circuit and the input/output circuit, and at least three MOS transistors provided between the data storage unit and the data wiring. The at least three MOS transistors may be multiple N-channel type MOS transistors and at least one P-channel type MOS transistor connected in parallel between the data storage unit and the data wiring, or at least one N-channel type MOS transistor and multiple P-channel type MOS transistors connected in parallel between the data storage unit and the data wiring.

Hereinafter, embodiments will be described with reference to drawings. In order to facilitate understanding of the description, the same elements are designated by the same reference numerals as much as possible in each drawing, and duplicate description is avoided.

Embodiment

Configuration of Memory System

As shown in FIG. 1, the memory system of the present embodiment includes a memory controller 1 and a semiconductor memory device 2. The semiconductor memory device 2 is a non-volatile storage device configured as a NAND flash memory. The memory system may be connected to a host. The host is, for example, an electronic device such as a personal computer or a mobile terminal. Only one semiconductor memory device 2 is shown in FIG. 1, but a plurality of semiconductor memory devices 2 are provided in an actual memory system.

The memory controller 1 controls the writing of data to the semiconductor memory device 2 according to a write request from the host. Further, the memory controller 1 controls reading of data from the semiconductor memory device 2 according to a read request from the host.

Between the memory controller 1 and the semiconductor memory device 2, a plurality of signals including a chip enable signal /CE, a ready busy signal /RB, a command latch enable signal CLE, an address latch enable signal ALE, a write enable signal /WE, read enable signals RE and /RE, a write protect signal /WP, a data signal DQ<7:0>, data strobe signals DQS and /DQS, are communicated.

The chip enable signal /CE is a signal for enabling the semiconductor memory device 2. The ready busy signal /RB is a signal for indicating whether the semiconductor memory device 2 is in a ready state or a busy state. The "ready state" is a state in which an external command can be received. The "busy state" is a state in which an external command cannot be received. The command latch enable signal CLE is a signal indicating that the signal DQ<7:0> is a command. The address latch enable signal ALE is a signal indicating that the signal DQ<7:0> is an address. The write enable signal/ WE is a signal for instructing the semiconductor memory device 2 to receive the signal DQ<7:0> therein, and is asserted by the memory controller 1 each time a command, an address, and data are transmitted through the signal DQ<7:0>. The memory controller 1 instructs the semiconductor memory device 2 to receive the signal DQ<7:0> therein while the signal /WE is at an "L (Low)" level.

The read enable signals RE and /RE are signals for the memory controller 1 to read data from the semiconductor memory device 2. The read enable signals RE and /RE are used, for example, to control the operation timing of the semiconductor memory device 2 that is outputting the signal DQ<7:0>. The write protect signal /WP is a signal for instructing the semiconductor memory device 2 to prohibit data writing and erasing. The signal DQ<7:0> contains data communicated between the semiconductor memory device 2 and the memory controller 1, and includes commands, addresses, and data. The data strobe signals DQS and /DQS are signals for controlling the input/output timing of the signal DQ<7:0>.

The memory controller 1 includes a RAM 11, a processor 12, a host interface 13, an ECC circuit 14, and a memory interface 15. These are connected to each other by an internal bus 16.

The host interface 13 outputs the request received from the host, user data (write data), and the like to the internal bus 16. Further, the host interface 13 transmits the user data read from the semiconductor memory device 2, the response from the processor 12, and the like to the host.

The memory interface 15 controls a process of writing user data and the like to the semiconductor memory device 2 and a process of reading the user data from the semiconductor memory device 2 based on the instruction of the processor 12.

The processor 12 controls the overall operation of the memory controller 1. The processor 12 is a CPU, an MPU, or the like. When receiving a request from the host via the host interface 13, the processor 12 performs control in response to the request. For example, the processor 12 instructs the memory interface 15 to write user data and parity to the semiconductor memory device 2 in response to a write request from the host. Further, the processor 12 instructs the memory interface 15 to read the user data and the parity from the semiconductor memory device 2 in response to a read request from the host.

The processor 12 determines a storage region (memory region) on the semiconductor memory device 2 with respect to the user data stored in the RAM 11. The user data is stored in the RAM 11 via the internal bus 16. The processor 12 determines the memory region for the page-based data (page data), which is a unit of writing. The user data stored in one page of the semiconductor memory device 2 is also referred to as "unit data" below. The unit data is generally encoded and stored in the semiconductor memory device 2 as a codeword. In the present embodiment, encoding is optional. The memory controller 1 may store the unit data in the semiconductor memory device 2 without encoding, and FIG. 1 illustrates a configuration in which encoding is performed as an example. When the memory controller 1 does not encode, the page data will match the unit data. Further, one codeword may be generated based on one unit data, or one codeword may be generated based on the divided data into which the unit data is divided. Moreover, one codeword may be generated by using a plurality of unit data.

The processor 12 determines the memory region of the semiconductor memory device 2 to be written for each unit data. A physical address is assigned to the memory region of the semiconductor memory device 2. The processor 12 manages the memory region to which the unit data is written by using the physical address. The processor 12 specifies the determined memory region (e.g., physical address) and instructs the memory interface 15 to write user data to the semiconductor memory device 2. The processor 12 manages the correspondence between the logical address (logical address managed by the host) of the user data and the physical address. When receiving a read request including a logical address from the host, the processor 12 identifies the physical address corresponding to the logical address, determines the physical address, and instructs the memory interface 15 to read user data.

The ECC circuit 14 encodes the user data stored in the RAM 11 to generate a codeword. Further, the ECC circuit 14 decodes the codeword read from the semiconductor memory device 2. The RAM 11 temporarily stores the user data received from the host until the user data is stored in the semiconductor memory device 2, or temporarily stores the data read from the semiconductor memory device 2 until the user data is transmitted to the host. The RAM 11 is a general-purpose memory such as a SRAM or a DRAM.

FIG. 1 illustrates a configuration example in which the memory controller 1 includes the ECC circuit 14 and the memory interface 15. The ECC circuit 14 may be built in the memory interface 15. Further, the ECC circuit 14 may be built in the semiconductor memory device 2. Each element illustrated in FIG. 1 is not limited to the specific configuration and arrangement thereof illustrated in FIG. 1.

When a write request is received from the host, the memory system in FIG. 1 operates as follows. The processor 12 temporarily stores the data to be written in the RAM 11. The processor 12 reads out the data stored in the RAM 11 and inputs the read data to the ECC circuit 14. The ECC circuit 14 encodes the input data and inputs the codeword to the memory interface 15. The memory interface 15 writes the codeword to the semiconductor memory device 2.

When a read request is received from the host, the memory system in FIG. 1 operates as follows. The memory interface 15 inputs the codeword read from the semiconductor memory device 2 to the ECC circuit 14. The ECC circuit 14 decodes the codeword and stores the decoded data in the RAM 11. The processor 12 transmits the data stored in the RAM 11 to the host via the host interface 13.

Schematic Configuration of Semiconductor Memory Device

Figure 2:
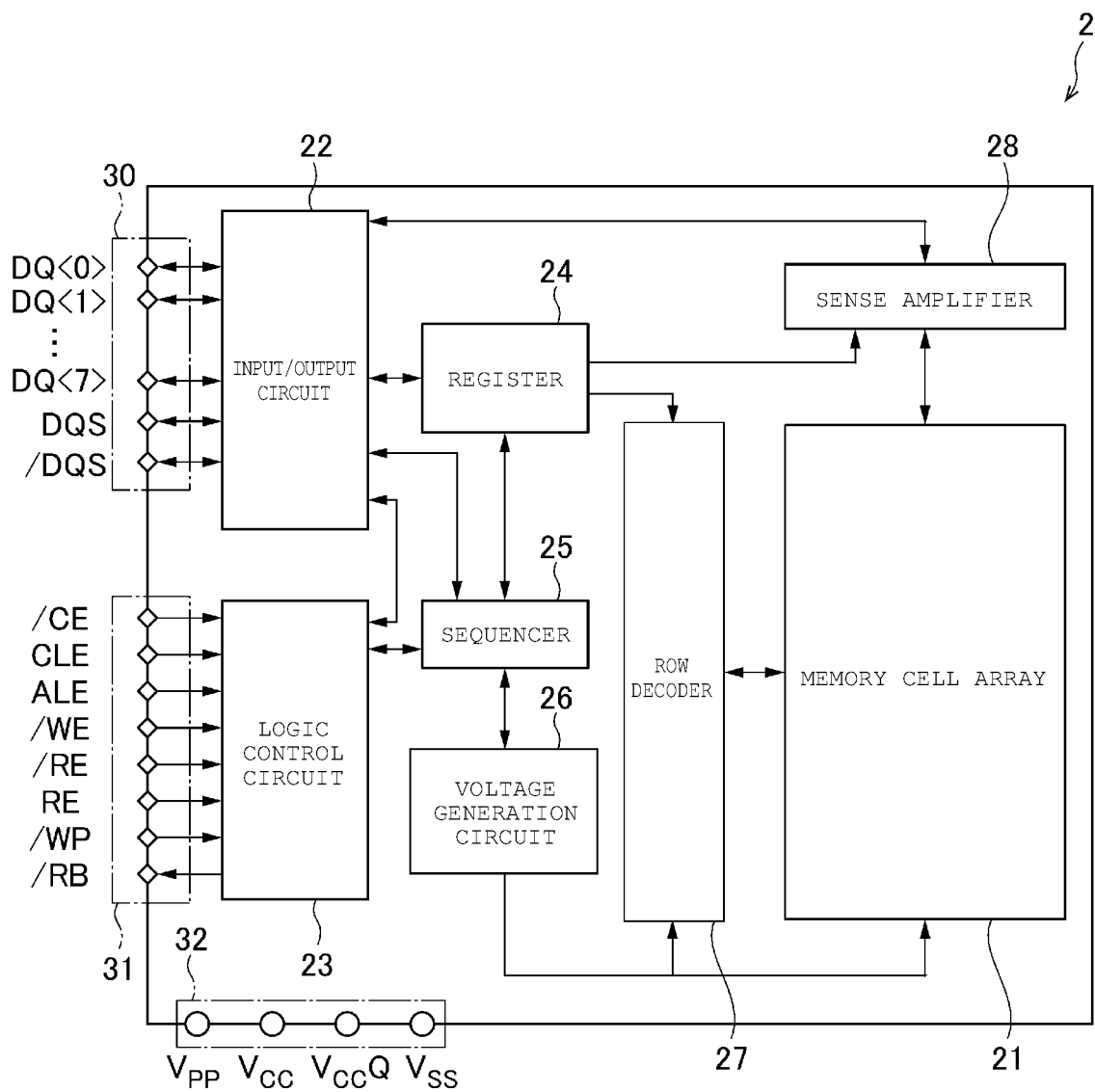
FIG. 2 is a block diagram showing a schematic configuration of a semiconductor memory device according to the embodiment.

As shown in FIG. 2, the semiconductor memory device 2 includes a memory cell array 21, an input/output circuit 22, a logic control circuit 23, a register 24, a sequencer 25, a voltage generation circuit 26, a row decoder 27, a sense amplifier 28, an input/output pad group 30, a logic control pad group 31, and a power input terminal group 32.

The memory cell array 21 stores data. The memory cell array 21 is configured to have a plurality of memory cell transistors associated with a plurality of bit lines and a plurality of word lines.

The input/output circuit 22 exchanges the signal DQ<7:0> and the data strobe signals DQS and /DQS with the memory controller 1. Further, the input/output circuit 22 transfers a command and an address in the signal DQ<7:0> to the register 24. Further, the input/output circuit 22 exchanges write data and read data with the sense amplifier 28.

The logic control circuit 23 receives the chip enable signal /CE, the command latch enable signal CLE, the address latch enable signal ALE, the write enable signal /WE, the read enable signals RE and /RE, and the write protect signal /WP from the memory controller 1. Further, the logic control circuit 23 transfers the ready busy signal /RB to the memory controller 1 to notify the state of the semiconductor memory device 2 to the outside.

The register 24 temporarily stores various data. For example, the register 24 stores commands for instructing a write operation, a read operation, an erasing operation, and the like. This command is input from the memory controller 1 to the input/output circuit 22, and then transferred from the input/output circuit 22 to the register 24 and stored. The register 24 also stores the address corresponding to the above command. This address is input from the memory controller 1 to the input/output circuit 22, and then transferred from the input/output circuit 22 to the register 24 and stored. Further, the register 24 also stores the state information indicating the operation state of the semiconductor memory device 2. The state information is updated by the sequencer 25 each time according to the operation state of the memory cell array 21 and the like. The state information is output from the input/output circuit 22 to the memory controller 1 as a state signal in response to the request from the memory controller 1.

The sequencer 25 controls the operation of each portion of the semiconductor memory device 2 including the memory cell array 21 based on the control signals input from the memory controller 1 to the input/output circuit 22 and the logic control circuit 23.

The voltage generation circuit 26 generates the voltage required for each of the data write operation, read operation, and erasing operation in the memory cell array 21. This voltage includes, for example, a voltage applied to a plurality of word lines and a plurality of bit lines of the memory cell array 21, respectively. The operation of the voltage generation circuit 26 is controlled by the sequencer 25.

The row decoder 27 is a circuit composed of a group of switches that are controlled to selectively apply a voltage to each of a plurality of word lines of the memory cell array 21. The row decoder 27 receives a block address and a row address from the register 24, selects a block based on the block address, and selects a word line based on the row address. The row decoder 27 switches the open/closed state of the switches so that the voltage from the voltage generation circuit 26 is applied to the selected word line. The operation of the row decoder 27 is controlled by the sequencer 25.

The sense amplifier 28 is a circuit for adjusting the voltage applied to the bit line of the memory cell array 21 or reading the voltage of the bit line and converting the read voltage into data. At the time of reading the data, the sense amplifier 28 acquires the data read from the memory cell transistor of the memory cell array 21 to the bit line, and transfers the acquired read data to the input/output circuit 22. When writing data, the sense amplifier 28 transfers the data written via the bit line to the memory cell transistor. The operation of the sense amplifier 28 is controlled by the sequencer 25.

The input/output pad group 30 includes a plurality of terminals (pads) for communicating signals between the memory controller 1 and the input/output circuit 22. Each terminal corresponds to one of the signal DQ<7:0> and the data strobe signals DQS and /DQS.

The logic control pad group 31 includes a plurality of terminals for communicating signals between the memory controller 1 and the logic control circuit 23. Each terminal corresponds to one of the chip enable signal /CE, the command latch enable signal CLE, the address latch enable signal ALE, the write enable signal /WE, the read enable signal RE and /RE, the write protect signal /WP, and the ready busy signal /RB.

The power input terminal group 32 includes a plurality of terminals for receiving voltages to be applied for the operation of the semiconductor memory device 2. The voltages applied to each terminal include power supply voltages Vcc, VccQ, Vpp, and a ground voltage Vss. The power supply voltage Vcc is a circuit power supply voltage supplied from the outside as an operation power supply, and is, for example, a voltage of about 3.3 V. The power supply voltage VccQ is, for example, a voltage of 1.2V. The power supply voltage VccQ is a voltage used when communicating signals between the memory controller 1 and the semiconductor memory device 2. The power supply voltage Vpp is a power supply voltage higher than the power supply voltage Vcc, and is, for example, a voltage of 12V.

Circuit Configuration of Memory Cell Array

Next, the circuit configuration of the memory cell array 21 will be described.

Figure 3:
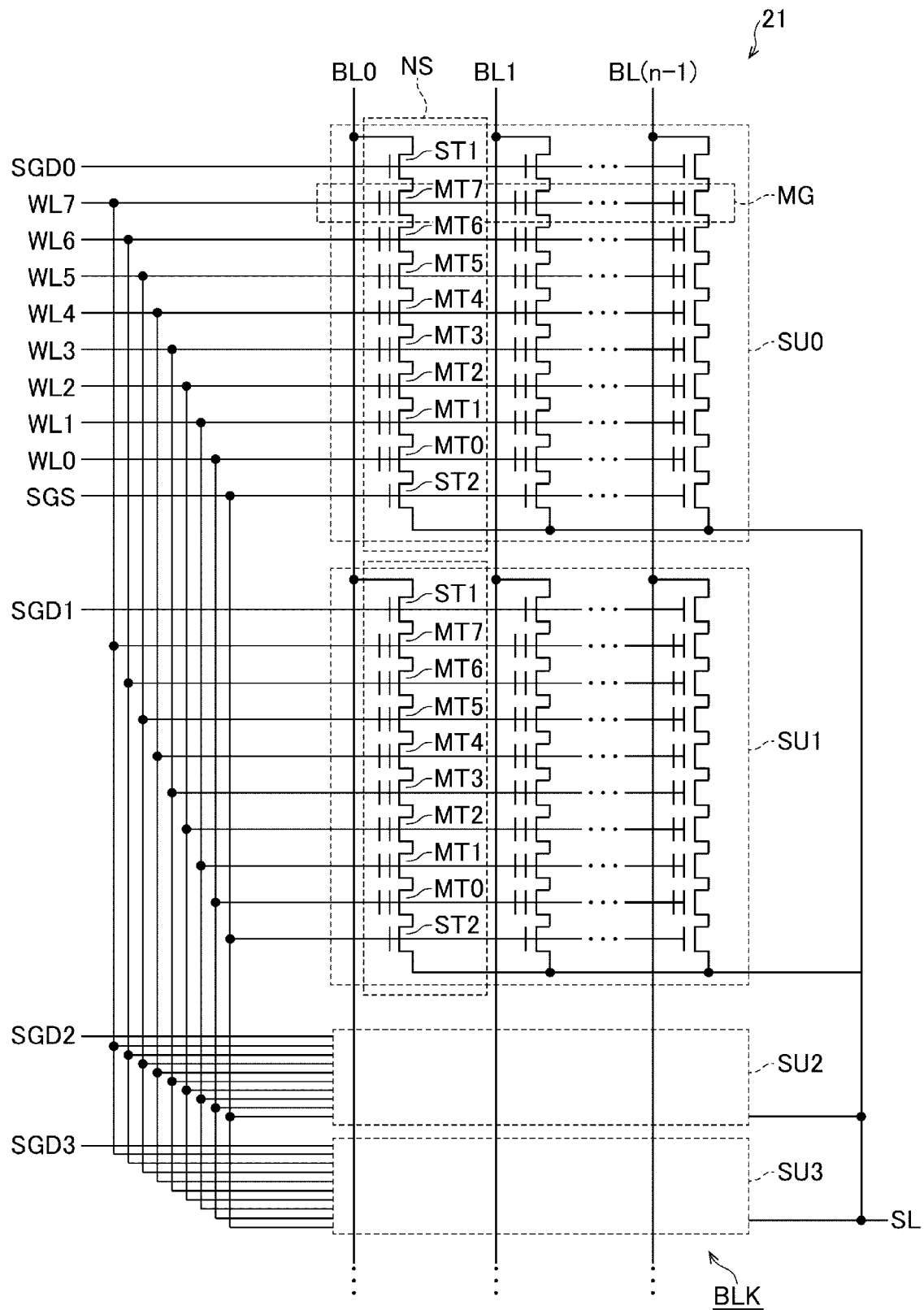
FIG. 3 is a circuit diagram showing a configuration of the semiconductor memory device according to the embodiment.

As shown in FIG. 3, the memory cell array 21 includes a plurality of blocks BLK. In FIG. 3, only one of the plurality of blocks BLK is shown. The configuration of the other block BLK provided in the memory cell array 21 is the same as that shown in FIG. 3.

As shown in FIG. 3, the block BLK includes, for example, four string units SU (SU0 to SU3). Further, each string unit SU includes a plurality of NAND strings NS. Each of the NAND strings NS includes, for example, eight memory cell transistors MT (MT0 to MT7) and select transistors ST1 and ST2.

The number of memory cell transistors MT is not limited to eight, and may be, for example, 32, 48, 64, or 96. In addition, in order to improve the cutoff characteristic, each of the select transistors ST1 and ST2 may include a plurality of transistors instead of a single transistor. Further, a dummy cell transistor may be provided between the memory cell transistor MT and the select transistors ST1 and ST2.

The memory cell transistors MT are connected in series between the select transistor ST1 and the select transistor ST2. The memory cell transistor MT7 on one end side of the NAND string is connected to the source of the select transistor ST1, and the memory cell transistor MT0 on the other end side of the NAND string is connected to the drain of the select transistor ST2.

The gates of the select transistors ST1 of the string units SU0 to SU3 are commonly connected to select gate lines SGD0 to SGD3, respectively. The gates of the select transistors ST2 are commonly connected to the same select gate line SGS across a plurality of string units SU in the same block BLK. The gates of the memory cell transistors MT0 to MT7 in the same block BLK are commonly connected to the word lines WL0 to WL7, respectively. That is, the word lines WL0 to WL7 and the select gate line SGS are common among a plurality of string units SU0 to SU3 in the same block BLK, whereas the select gate line SGD is individually provided for each string unit SU0 to SU3 even in the same block BLK.

The memory cell array 21 is provided with n bit lines BL (BL0, BL1, . . . , BL (n−1)). "n" is an integer corresponding to the number of NAND strings NS provided in one string unit SU. For example, when the semiconductor memory device 2 is configured to write to the memory cell array 21 or read from the memory cell array 21 with 16 k Byte data as one unit, "n" is 131072 (2 to the 17th power). The drain of each select transistor ST1 of the NAND string NS is connected to the corresponding bit line BL. The source of each select transistor ST2 of the NAND string NS is connected to a source line SL. The source line SL is common to the sources of a plurality of select transistors ST2 provided in the block BLK.

The data stored in a plurality of memory cell transistors MT in the same block BLK are collectively erased. On the other hand, reading and writing of data are collectively performed for the plurality of memory cell transistors MT connected to one word line WL and belonging to one string unit SU.

In the following description, a set of 1-bit data connected to one word line WL and stored by the plurality of memory cell transistors MT belonging to one string unit SU is referred to as a "page". In FIG. 3, a reference numeral "MG" is attached to one of the sets including the plurality of memory cell transistors MT as described above.

Configuration of Sense Amplifier

Figure 4:
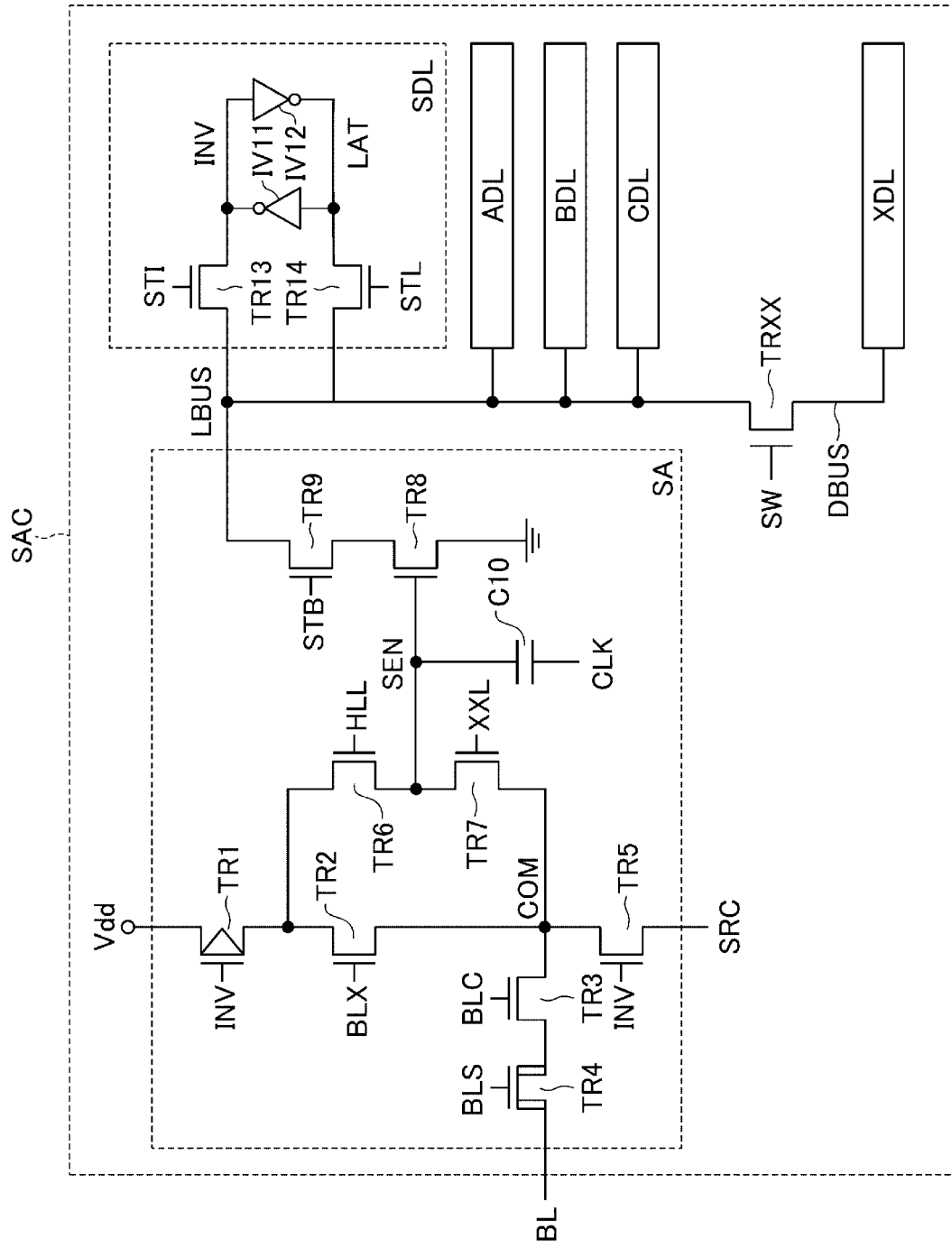
FIG. 4 is a block diagram showing a schematic configuration of a sense amplifier unit according to the embodiment.

The sense amplifier 28 includes n sense amplifier circuits associated with n bit lines BL, respectively. FIG. 4 shows the circuit configuration of one sense amplifier circuit SAC of the n sense amplifier circuits.

As shown in FIG. 4, the sense amplifier circuit SAC includes a sense amplifier unit SA and data latch circuits SDL, ADL, BDL, CDL, and XDL. The sense amplifier unit SA and the data latch circuits SDL, ADL, BDL, CDL, and XDL are connected by a bus LBUS so that data can be communicated to each other. More specifically, the data latch circuits SDL, ADL, BDL, and CDL are commonly connected via the bus LBUS, and the data latch circuit XDL is connected to a bus DBUS. The bus LBUS and the bus DBUS are connected via a transistor TRXX. A control signal SW is input to the gate of the transistor TRXX. The control signal SW is generated by, for example, the sequencer 25.

In a read operation, the sense amplifier unit SA senses the data read to the corresponding bit line BL, and determines whether the read data is "0" or "1". The sense amplifier unit SA includes, for example, a transistor TR1 which is a P-channel type MOS transistor, transistors TR2 to TR9 which are N-channel type MOS transistors, and a capacitor C10.

One end of the transistor TR1 is connected to a power supply line, and the other end of the transistor TR1 is connected to the transistor TR2. The gate of the transistor TR1 is connected to a node INV in the data latch circuit SDL. One end of the transistor TR2 is connected to the transistor TR1, and the other end of the transistor TR2 is connected to a node COM. A control signal BLX is input to the gate of the transistor TR2. One end of the transistor TR3 is connected to the node COM, and the other end of the transistor TR3 is connected to the transistor TR4. A control signal BLC is input to the gate of the transistor TR3. The transistor TR4 is a high breakdown voltage MOS transistor. One end of the transistor TR4 is connected to the transistor TR3. The other end of the transistor TR4 is connected to the corresponding bit line BL. A control signal BLS is input to the gate of the transistor TR4.

One end of the transistor TR5 is connected to the node COM, and the other end of the transistor TR5 is connected to a node SRC. The gate of the transistor TR5 is connected to the node INV. One end of the transistor TR6 is connected between the transistor TR1 and the transistor TR2, and the other end of the transistor TR6 is connected to a node SEN. A control signal HLL is input to the gate of the transistor TR6. One end of the transistor TR7 is connected to the node SEN, and the other end of the transistor TR7 is connected to the node COM. A control signal XXL is input to the gate of the transistor TR7.

One end of the transistor TR8 is grounded, and the other end of the transistor TR8 is connected to the transistor TR9. The gate of the transistor TR8 is connected to the node SEN. One end of the transistor TR9 is connected to the transistor TR8, and the other end of the transistor TR9 is connected to the bus LBUS. A control signal STB is input to the gate of the transistor TR9. One end of the capacitor C10 is connected to the node SEN. A clock CLK is input to the other end of the capacitor C10.

The control signals BLX, BLC, BLS, HLL, XXL, and STB are generated by, for example, the sequencer 25. Further, for example, a voltage Vdd which is the internal power supply voltage of the semiconductor memory device 2 is applied to the power supply line connected to one end of the transistor TR1, and the voltage Vss which is the ground voltage of the semiconductor memory device 2 is applied to the node SRC, for example.

The data latch circuits SDL, ADL, BDL, CDL, and XDL temporarily store the read data. The data latch circuit XDL is connected to the input/output circuit 22 and is used for input and output of data between the sense amplifier circuit SAC and the input/output circuit 22.

The data latch circuit SDL includes, for example, inverters IV11 and IV12 and transistors TR13 and TR14 which are N-channel type MOS transistors. The input node of the inverter IV11 is connected to a node LAT. The output node of the inverter IV11 is connected to the node INV. The input node of the inverter IV12 is connected to the node INV. The output node of the inverter IV12 is connected to the node LAT. One end of the transistor TR13 is connected to the node INV, and the other end of the transistor TR13 is connected to the bus LBUS. A control signal STI is input to the gate of the transistor TR13. One end of the transistor TR14 is connected to the node LAT, and the other end of the transistor TR14 is connected to the bus LBUS. A control signal STL is input to the gate of the transistor TR14.

The data stored in the node LAT corresponds to the data stored in the data latch circuit SDL. Further, the data stored in the node INV corresponds to the inverted data of the data stored in the node LAT. Since the circuit configurations of the data latch circuits ADL, BDL, and CDL are the same as the circuit configuration of the data latch circuit SDL, the description thereof will be omitted. Hereinafter, the data latch circuits ADL, BDL, and CDL are collectively referred to as "data latch circuit DL". The circuit configuration of the data latch circuit XDL will be described later.

Figure 5:
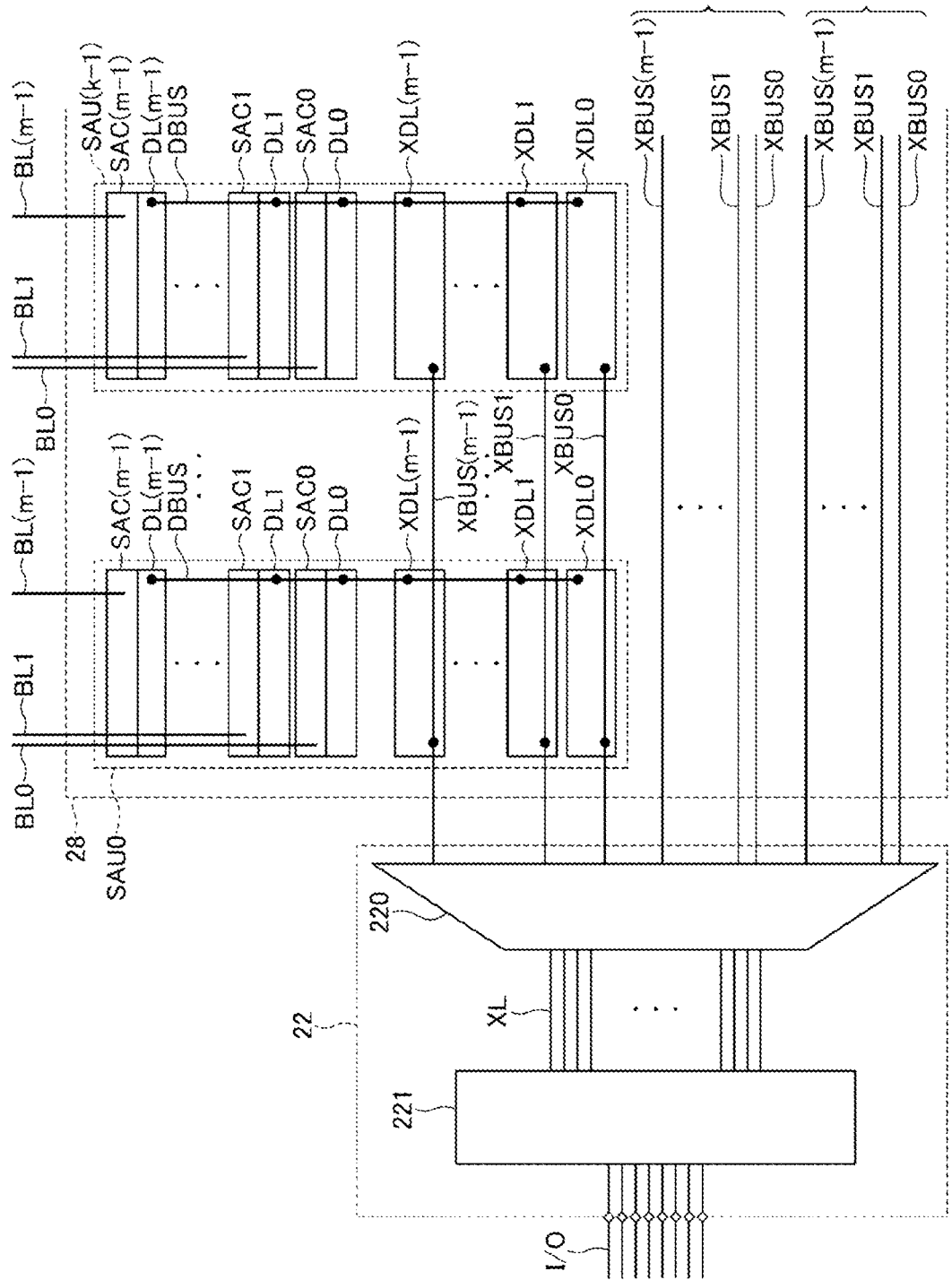
FIG. 5 is a block diagram showing a schematic configuration of a sense amplifier and an input/output circuit according to the embodiment.

As shown in FIG. 5, the sense amplifier 28 has k sense amplifier units SAU (SAU0 to SAU(k−1)). One sense amplifier unit SAU has m sense amplifier circuits SAC (SAC0 to SAC(m−1)), m data latch circuits DL (DL0 to DL(m−1)), and m data latch circuits XDL (XDL0 to XDL(m−1)). "m" and "k" are integers and satisfy "m×k=n". "m" is, for example, 16 (2 to the 4th power), and "k" is 8192 (2 to the 13th power). In other words, n (131072, 2 to the 17th power) sense amplifier circuits SAC are divided into k (8192, 2 to the 13th power) sense amplifier units SAU, and each sense amplifier unit SAU includes m (16, 2 to the 4th power) sense amplifier circuits SAC.

The m data latch circuits XDL0 to XDL (m−1) are connected to the input/output circuit 22 via m buses XBUS (XBUS0 to XBUS(m−1)). The m buses XBUS0 to XBUS (m−1) are commonly provided for, for example, a plurality of 32 to 64 sense amplifier units SAU. In other words, for example, the plurality of 32 to 64 sense amplifier units SAU are connected to the m buses XBUS0 to XBUS(m−1). A plurality of sense amplifier units SAU are connected to the input/output circuit 22 via the buses XBUS0 to XBUS(m−1). As described above, the buses XBUS0 to XBUS(m−1) to which the plurality of sense amplifier units SAU are connected are configured as one set, and the plurality of sets of buses XBUS0 to XBUS(m−1) are connected to the input/output circuit 22. In the present embodiment, the bus XBUS corresponds to the data wiring.

The input/output circuit 22 includes a data conversion unit 220 and an input/output control unit 221. The data conversion unit 220 and the input/output control unit 221 are connected to each other via a plurality of wirings XL.

By functioning as a serializer during a read operation, the data conversion unit 220 converts parallel data transmitted from the data latch circuits XDL0 to XDL (m−1) via the buses XBUS0 to XBUS (m−1) into serial signals and transmits the serial signals to the input/output control unit 221 via a plurality of wirings XL. By functioning as a deserializer during a write operation, the data conversion unit 220 converts the serial signal transmitted from the input/output control unit 221 via the plurality of wirings XL into parallel data and transmits the parallel data to each of the buses XBUS0 to XBUS (m−1).

The input/output control unit 221 is a portion that controls transmission of a serial signal between a plurality of input/output lines I/O and a plurality of wirings XL.

Configuration of Data Latch Circuit XDL

Next, the configuration of the data latch circuit XDL will be described.

Figure 6:
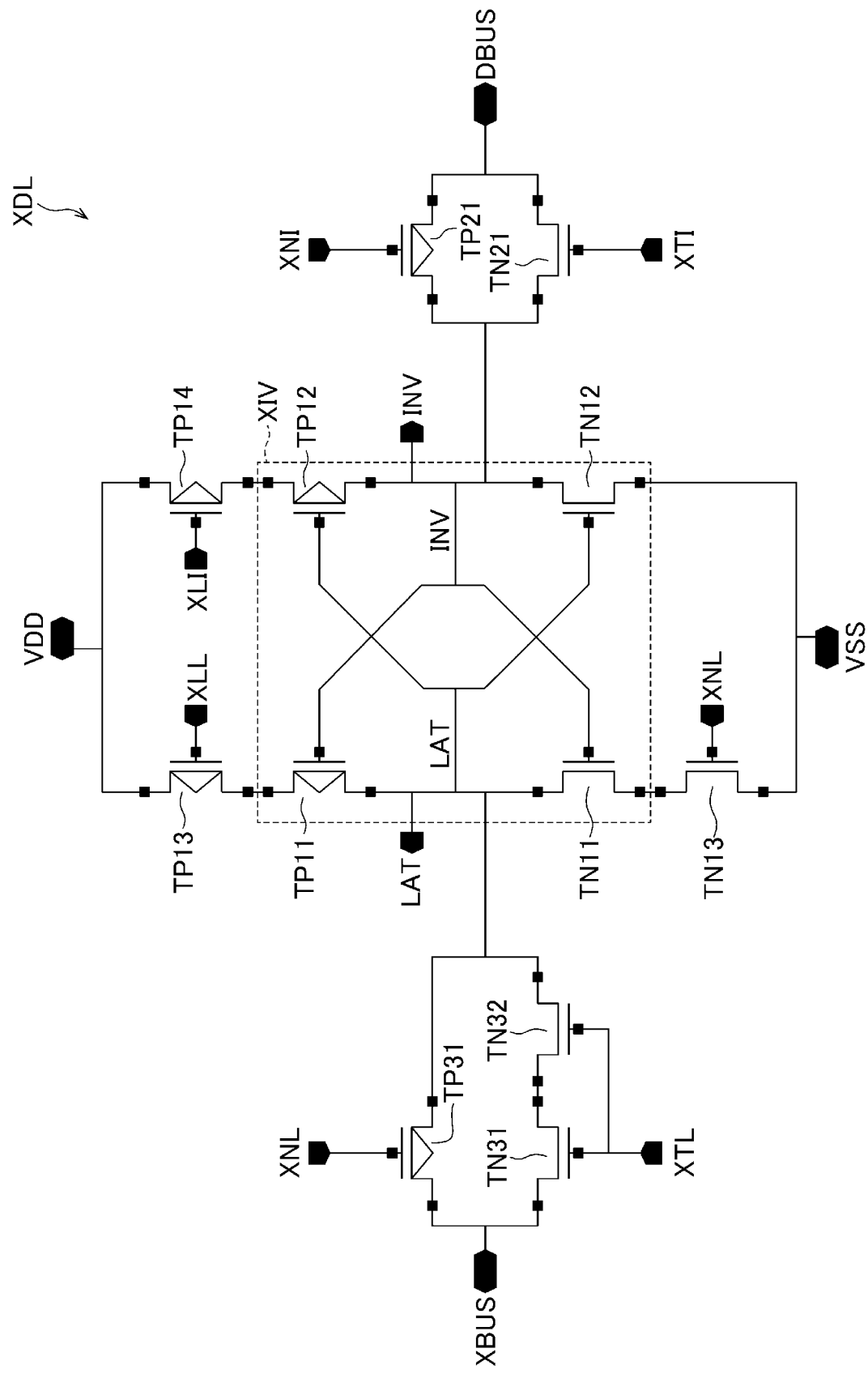
FIG. 6 is a circuit diagram showing a configuration of a data latch circuit according to the embodiment.

As shown in FIG. 6, the data latch circuit XDL includes P-channel type MOS transistors TP11-TP14, TP21, and TP31, and N-channel type MOS transistors TN11-TN13, TN21, TN31, and TN32. The transistors TP11, TP12, TN11, and TN12 form a cross-connected inverter circuit XIV. That is, the transistors TP11 and TN11 form a first inverter circuit and are connected in series at the node LAT. Each gate of the transistors TP11 and TN11 is connected to the node INV. The node LAT and the node INV function as an output and an input of the first inverter circuit, respectively. The transistors TP12 and TN12 form a second inverter circuit and are connected in series at the node INV. Each gate of the transistors TP12 and TN12 is connected to the node LAT.

The node LAT and the node INV function as an input and an output of the second inverter circuit, respectively.

Of the two ends of the current path of the transistor TP11, the end opposite to the end connected to the node LAT is connected to a power voltage node VDD via the transistor TP13. The power voltage Vdd is supplied to the power voltage node VDD. A control signal XLL generated by the sequencer 25 is input to the gate of the transistor TP13. The transistor TP13 functions as a switch circuit that is turned on/off based on the control signal XLL.

Of the two ends of the current path of the transistor TP12, the end opposite to the end connected to the node INV is connected to the power voltage node VDD via the transistor TP14. A control signal XLI generated by the sequencer 25 is input to the gate of the transistor TP14. The transistor TP12 functions as a switch circuit that is turned on/off based on the control signal XLI.

Of the two ends of the current path of the transistor TN11, the end opposite to the end connected to the node LAT is connected to a ground voltage node VSS via the transistor TN13. The ground voltage Vss is supplied to the ground voltage node VSS. A control signal XNL generated by the sequencer 25 is input to the gate of the transistor TN13. The transistor TN13 functions as a switch circuit that is turned on/off based on the control signal XNL.

Of the two ends of the current path of the transistor TN12, the end opposite to the end connected to the node INV is connected to the ground voltage node VSS.

The transistors TP21 and TN21 are connected in parallel between the bus DBUS and the node INV. A control signal XNI generated by the sequencer 25 is input to the gate of the transistor TP21. A control signal XTI generated by the sequencer 25 is input to the gate of the transistor TN21. The transistors TP21 and TN21 function as a switch circuit that is turned on/off based on the control signals XNI and XTI.

The transistors TP31, TN31, and TN32 are connected between the bus XBUS and the node LAT. The transistors TN31 and TN32 are connected in series. The transistor TP31 is connected in parallel to the transistors TN31 and TN32 that are connected in series. The control signal XNL generated by the sequencer 25 is input to the gate of the transistor TP31. A control signal XTL generated by the sequencer 25 is input to each gate of the transistors TN31 and TN32. The transistors TP31, TN31, and TN32 function as a switch circuit that is turned on/off based on the control signals XNL and XTL. In the present embodiment, the transistors TN31 and TN32 correspond to multiplexed transistors.

Cross-sectional Structure of Semiconductor Memory Device

Figure 7:
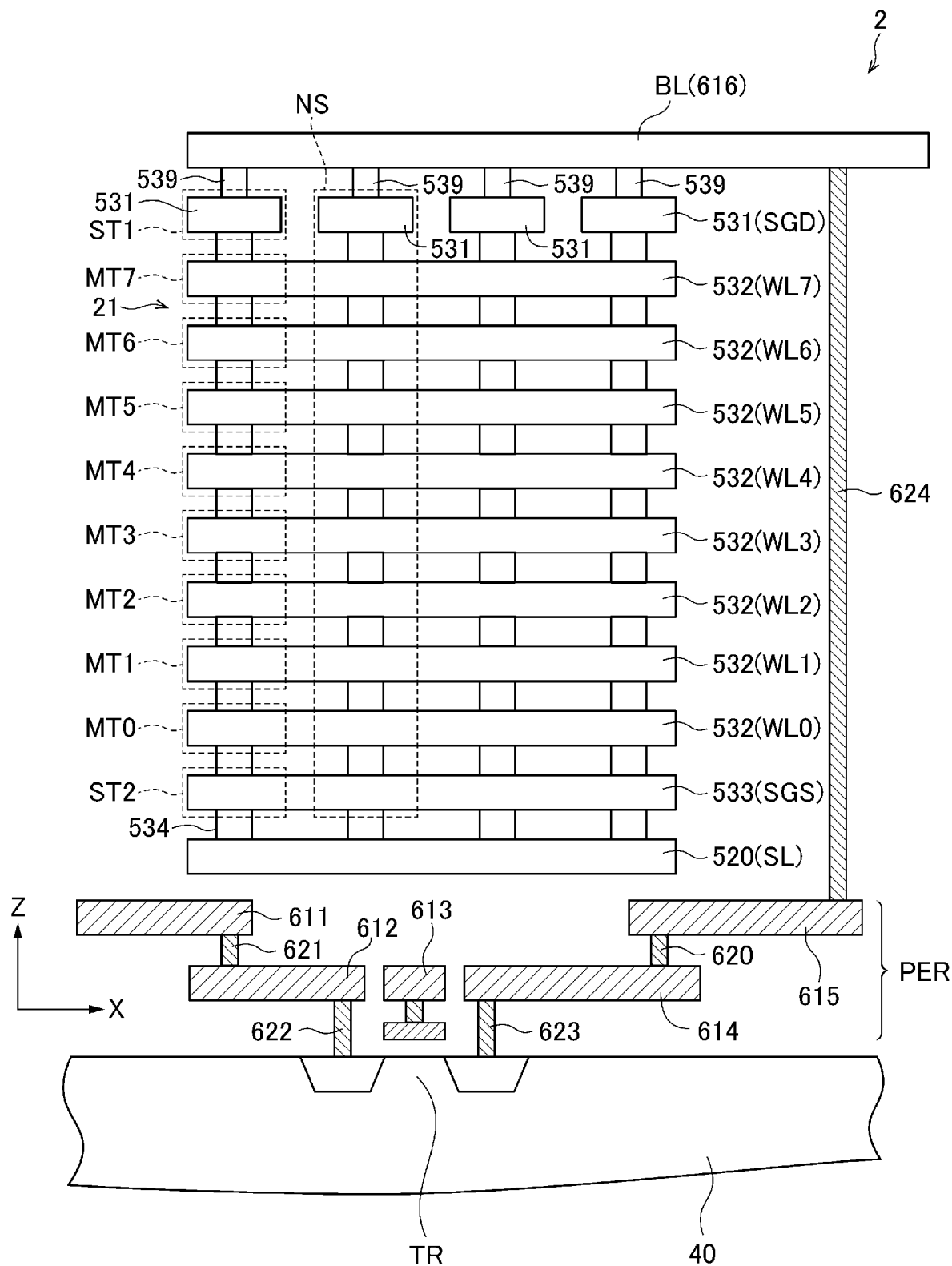
FIG. 7 is a cross-sectional diagram showing a cross-sectional structure of the semiconductor memory device according to the embodiment.

As shown in FIG. 7, the semiconductor memory device 2 has a structure in which a peripheral circuit PER and the memory cell array 21 are sequentially arranged on a semiconductor substrate 40.

In the memory cell array 21, a plurality of NAND strings NS are formed on a conductor layer 520. The conductor layer 520 is also referred to as an embedded source line (BSL), and corresponds to the source line SL in FIG. 3.

Above the conductor layer 520, a wiring layer 533 that functions as a select gate line SGS, a plurality of wiring layers 532 that function as a word line WL, and a wiring layer 531 that functions as a select gate line SGD are stacked. An insulating layer (not shown) is disposed between each of the stacked wiring layers 533, 532, and 531.

A plurality of memory holes 534 are formed in the memory cell array 21. The memory hole 534 is a hole that penetrates the wiring layers 533, 532, 531 and the insulating layer (not shown) therebetween in the vertical direction and reaches the conductor layer 520.

Each portion of the memory hole 534 that intersects each of the stacked wiring layers 533, 532, and 531 functions as a transistor. Among these plurality of transistors, the one in the portion intersecting with the wiring layer 531 functions as the select transistor ST1. Among the plurality of transistors, the ones in the portions intersecting with the wiring layers 532 function as memory cell transistors MT (MT0 to MT7). Among the plurality of transistors, the one in the portion intersecting with the wiring layer 533 functions as the select transistor ST2.

A wiring layer 616 that functions as a bit line BL is formed above the memory hole 534. The upper end of the memory hole 534 is connected to the wiring layer 616 via a contact plug 539.

A plurality of structures similar to the structure shown in FIG. 7 are arranged in the depth direction of the paper surface of FIG. 7. One string unit SU is formed by a set of a plurality of NAND strings NS arranged along a line in the depth direction of the paper surface of FIG. 7.

The semiconductor substrate 40 and the conductor layer 520 (source line SL) are disposed apart from each other, and a part of the peripheral circuit PER is disposed therebetween. The peripheral circuit PER is a circuit used in a data write operation, a read operation, an erasing operation, and the like in the memory cell array 21. The sense amplifier 28, the row decoder 27, the voltage generation circuit 26, and the like shown in FIG. 2 are parts of the peripheral circuit PER.

The peripheral circuit PER includes a transistor TR formed on the upper surface of the semiconductor substrate 40 and a plurality of conductors 611 to 615. The conductors 611 to 615 are wiring layers formed of conductors such as, for example, metal. The conductors 611 to 615 are distributed at a plurality of height positions, and are electrically connected to each other via contacts 620 to 623. The contacts 620 to 623 are formed by forming contact holes so as to penetrate the insulating layer (not shown) in the vertical direction, and then filling the inside of the contact holes with a conductor material such as tungsten. The conductor 615 is electrically connected to the wiring layer 616 (bit line BL) via a contact 624.

FIG. 8A schematically shows a part of the structure of the peripheral circuit PER of the semiconductor memory device 2, particularly the planar structure of the portion constituting the data latch circuit XDL. FIG. 8A shows the planar structure of the portion of two data latch circuits XDL1 and XDL2 according to a first example of the embodiment. As shown in FIG. 8A, in the semiconductor memory device 2, a source/drain portion LW1, a gate portion LT1, a source/drain portion LW2, a gate portion LT2, a source/drain portion LW3, and a gate unit LT3 are disposed in this order.

In the source/drain portion LW1, source/drain portions LW1_1 and LW1_2 that function as the source or drain of the respective transistors TN31 of the data latch circuits XDL1 and XDL2 are disposed. The source/drain portions LW1_1 and LW1_2 are connected to the bus XBUS. Gate portions LT1_1 and LT_2 that function as gates of the respective transistors TN31 of the data latch circuits XDL1 and XDL2 are disposed in the gate portion LT1. Vias V31 connected to the gate of the transistor TN31 are formed in the gate portions LT1_1 and LT1_2, respectively. In the source/drain portion LW2, source/drain portions LW2_1 and LW2_2 that function as the source or drain of the respective transistors TN31 of the data latch circuits XDL1 and XDL2 and as the source or drain of the transistors TN32 thereof are disposed.

In the gate portion LT2, gate portions LT2_1 and LT2_2 that function as gates of the respective transistors TN32 of the data latch circuits XDL1 and XDL2 are disposed. Vias V32 connected to the gate of the transistor TN32 are formed in the gate portions LT2_1 and LT2_2, respectively. In the source/drain portion LW3, source/drain portions LW3_1 and LW3_2 that function as the source or drain of the respective transistors TN32 of the data latch circuits XDL1 and XDL2 and as the source or drain of the transistor TN11 are disposed. The source/drain portions LW3_1 and LW3_2 are connected to the node LAT. In the gate portion LT3, gate portions LT3_1 and LT3_2 that function as gates of the respective transistors TN11 of the data latch circuits XDL1 and XDL2 are disposed.

When the direction in which portions LW1, LT1, LW2, LT2, LW3, and LT3 are disposed is a depth direction Y, the via V31 and the via V32 are disposed along the same straight line parallel to the depth direction Y. A common wiring LTG extending in the depth direction Y is connected to the via V31 and the via V32. The control signal XTL is input from the sequencer 25 to the via V31 and the via V32 via the wiring LTG. In the present embodiment, the wiring LTG corresponds to a common signal line.

As shown in FIG. 8A, the semiconductor memory device 2 of the present embodiment employs a so-called double gate structure in which the gate of the transistor TN31 and the gate of the transistor TN32, of each data latch circuit XDL1 and XDL2, are provided in different portions. When the double gate structure is employed, as shown in FIG. 8A, portions LW1_1, LT1_1, LW2_1, LT2_1, LW3_1, and LT3_1 of one data latch circuit XDL1 and portions LW1_2, LT1_2, LW2_2, LT2_2, LW3_2, and LT3_2 of the other data latch circuit XDL2 can be respectively arranged side by side in a horizontal direction X.

Figure 8B:
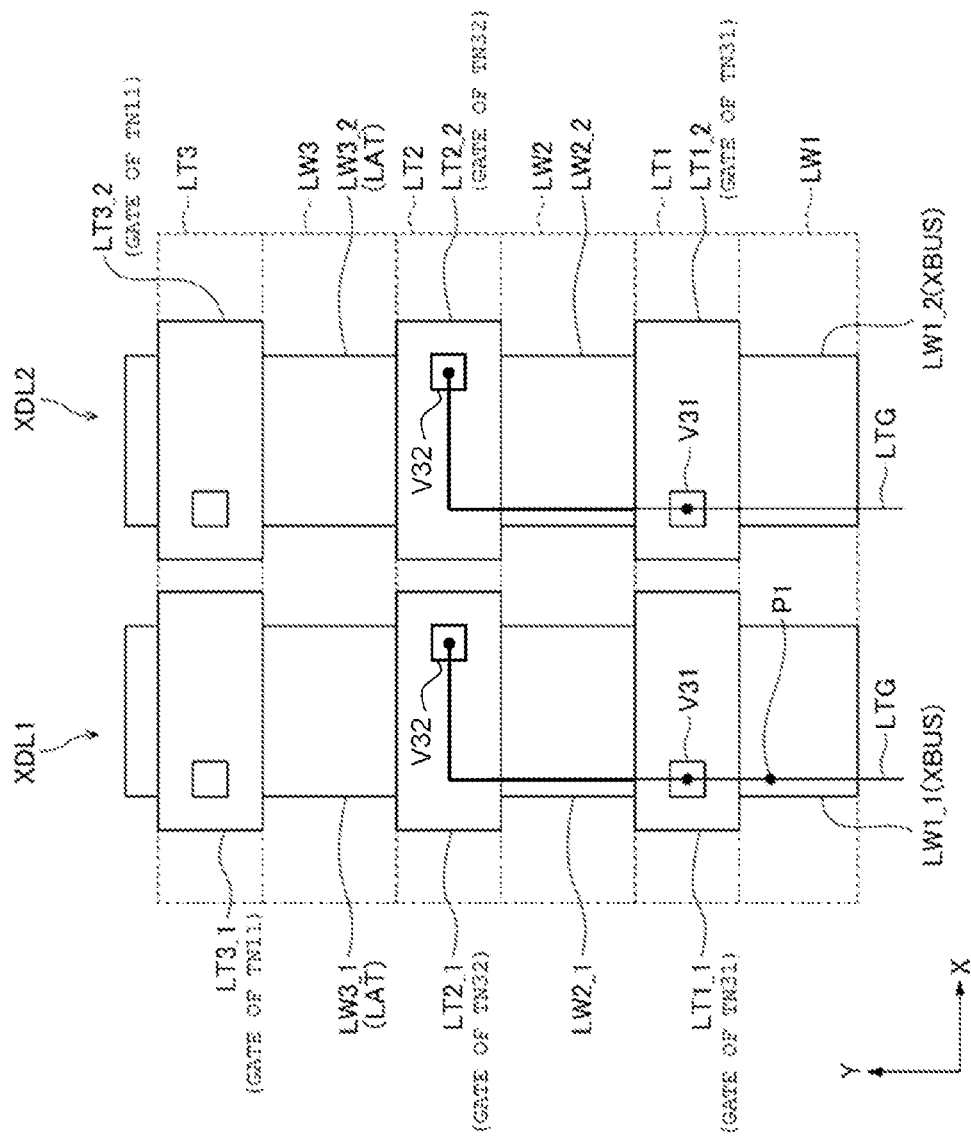
FIG. 8B is a diagram schematically showing a planar structure around the data latch circuit of the semiconductor memory device according to a second example of the embodiment.

In the peripheral circuit PER of the semiconductor memory device 2, the data latch circuit XDL may be arranged as shown in FIG. 8B. FIG. 8B shows the planar structure of the portion of two data latch circuits XDL1 and XDL2 according to a second example of the embodiment. In the second example, the via V31 of the transistor TN31 and the via V32 of the transistor TN32 are disposed so as not to overlap each other in the depth direction Y. In addition, a common wiring LTG extending in the depth direction Y and in the horizontal direction to be connected to both of the via V31 and the via V32.

Figure 9:
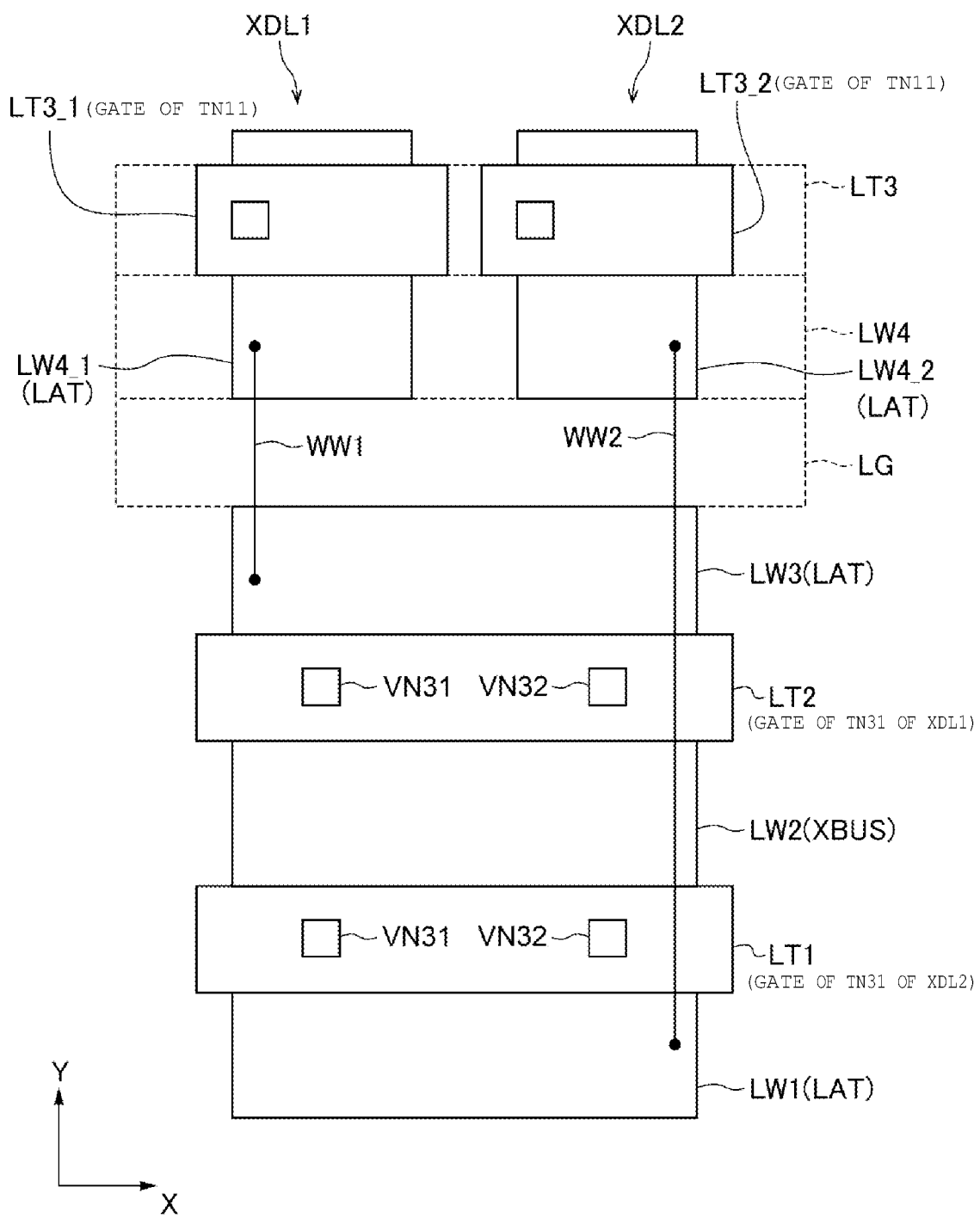
FIG. 9 is a diagram schematically showing a planar structure around a data latch circuit of a semiconductor memory device according to a variation of the embodiment.
Figure 15:
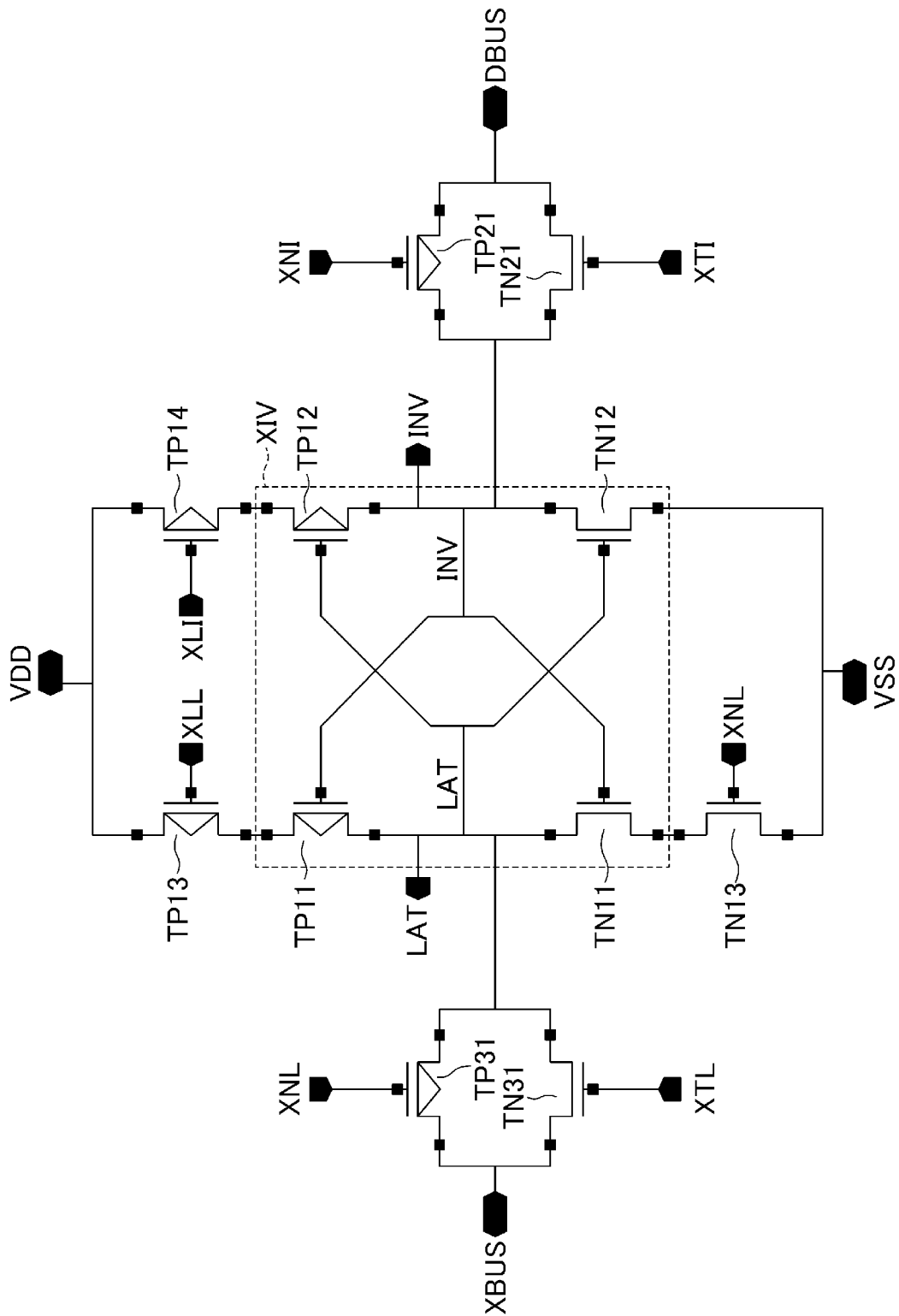
FIG. 15 is a circuit diagram showing a configuration of the data latch circuit according to the variation of the embodiment.

FIGS. 9 and 15 show a semiconductor memory device 2 according to a variation of the present embodiment. In the semiconductor memory device 2 according to the variation of the present embodiment shown in FIGS. 9 and 15, instead of providing the two transistors TN31 and TN32, two vias VN31 and VN32 are provided on a transistor TN31. In other words, in the variation of the present embodiment, a double via structure is employed unlike a double gate structure of the embodiment. In the semiconductor memory device 2 of the variation of the present embodiment shown in FIGS. 9 and 15, the source/drain portion LW1, the gate portion LT1, the source/drain portion LW2, the gate portion LT2, the source/drain portion LW3, the gap portion LG, the source/drain portion LW4, and the gate portion LT3 are disposed in this order.

The source/drain portion LW1 functions as source or drain of the transistor TN31 of the other data latch circuit XDL2. The source/drain portion LW1 is connected to the node LAT. The gate portion LT1 functions as the gate of the transistor TN31 of the other data latch circuit XDL2. The gate portion LT1 is provided with the vias VN31 and VN32 to connect a control signal line with the gate of the transistor TN31. The source/drain portion LW2 functions as source or drain of the transistor TN31 of one data latch circuit XDL1 and as sources or drain of the transistor TN31 of the other data latch circuit XDL2. The source/drain portion LW2 is connected to the bus XBUS.

The gate portion LT2 functions as the gate of the transistor TN31 of the one data latch circuit XDL1. The gate portion LT2 is provided with the vias VN31 and VN32 to connect a control signal line with the gate of the transistor TN31. The source/drain portion LW3 functions as source or drain of the transistor TN31 of the one data latch circuit XDL1. The source/drain portion LW3 is connected to the node LAT. The gap portion LG is provided between the source/drain portion LW3 and the source/drain portion LW4.

In the source/drain portion LW4, source/drain portions LW4_1 and LW4_2 that function as the sources or drains of the respective transistors TN11 of the data latch circuits XDL1 and XDL2 are disposed. The source/drain portion LW4_1 is connected to the source/drain portion LW3 via the wiring WW1. The source/drain portion LW4_2 is connected to the source/drain portion LW1 via the wiring WW2. The source/drain portions LW4_1 and LW4_2 are connected to the node LAT. In the gate portion LT3, gate portions LT3_1 and LT3_2 that function as gates of the respective transistors TN11 of the data latch circuits XDL1 and XDL2 are disposed.

The semiconductor memory device 2 of the variation of the present embodiment provides two vias VN31 and VN32 on each of the gate portions LT1 and LT2 in order to avoid disconnection of the control signal lines from the gate portions LT1 and LT2. For example, even if one of the vias VN31 and VN32 becomes defective in the manufacturing stage, the control signal lines still can be electrically connected the gate portions LT1 and LT2. Therefore, even if the voltage of the source/drain portion LW3 unintentionally changes, it does not affect the source/drain portion LW2. However, to provide two vias on a gate of a transistor, it is necessary to double a width of the gate. Since the transistors of the data latch circuits XDL are arranged in a matrix in view of total area efficiency and other reasons, as a result of providing two vias on each of the gate portion LT1 (a gate of the transistor NT31 of one data latch circuit XDL1 shown in FIG. 15) and the gate portion LT2 (a gate of the transistor NT31 of another data latch circuit XDL2 shown in FIG. 15), for example, it is necessary to form a gap portion LG to divide the source/drain portion LW3 (a source/drain of the transistor NT31 of the one data latch circuit XDL1 shown in FIG. 15) and the source/drain portion LW4 (a source/drain of the transistor NT11 of the other data latch circuit XDL2 shown in FIG. 15) from each other. As shown in FIG. 8A, since the semiconductor memory device 2 of the present embodiment does not require such a configuration, the semiconductor memory device 2 can be made thinner by that amount. As a result, in the semiconductor memory device 2 of the present embodiment, the chip area can be further reduced, and the cost can be further reduced.

Operation Example of Data Latch Circuit XDL

Next, an operation example of the data latch circuit XDL will be described.

Data Latch

Figure 10:
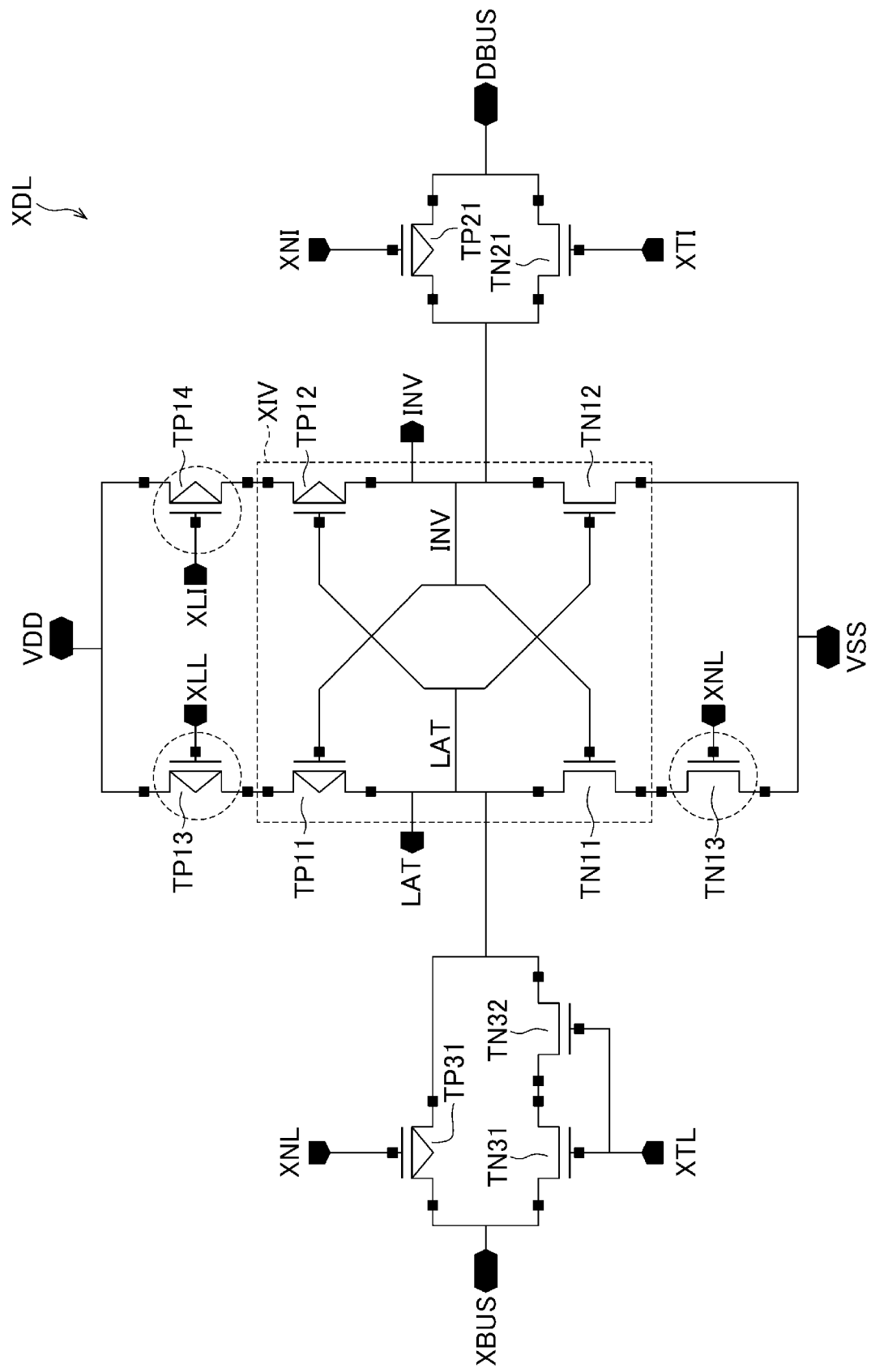
FIG. 10 is a circuit diagram showing an operation example of the data latch circuit according to the embodiment.

The sequencer 25 operates the data latch circuit XDL as shown in FIG. 10 when latching data in the data latch circuit XDL. As shown in FIG. 10, the sequencer 25 keeps the control signals XTL, XTI, XLI, XLL at a low level and the control signals XNL, XNI at a high level. The high level has a voltage large enough to turn off the P-channel type MOS transistor and turn on the N-channel type MOS transistor, for example, the power voltage Vdd. The low level has a voltage large enough to turn on the P-channel type MOS transistor and turn off the N-channel type MOS transistor, for example, the ground voltage Vss.

When the voltages of the control signals XNL, XTL, XTI, XLI, XLL, and XNI are set to the above levels, the transistors TP13, TP14, and TN13 are turned to be the ON state, and the transistors TP21, TN21, TP31, TN31, and TN32 are turned to be the OFF state. In FIG. 10, the transistor in the ON state is surrounded by a broken line. Due to such an ON/OFF state of a transistor, both the node LAT and INV are disconnected from both the buses DBUS and XBUS. On the other hand, since the cross-connected inverter circuit XIV is connected to the power voltage node VDD and the ground voltage node VSS, the respective voltages of the nodes LAT and INV are maintained. That is, the node LAT keeps a high or low level voltage depending on the digital data stored by the data latch circuit XDL. The node INV keeps a voltage at the opposite level of the level of digital data stored by the data latch circuit XDL. As described above, in the present embodiment, the cross-connected inverter circuit XIV corresponds to a data storage unit that temporarily stores data input and output between the sense amplifier circuit SAC and the input/output circuit 22.

Data Input from Bus DBUS

The sequencer 25 turns the transistor TRXX to be in the ON state by setting the control signal SW shown in FIG. 4 to a high level when transferring data from the bus LBUS to the data latch circuit XDL through the bus DBUS. Therefore, the bus LBUS previously has a voltage based on the data to be transferred to the data latch circuit XDL. If the data to be transferred is at a high level, the voltage of the bus DBUS is kept at a high level. On the other hand, if the data to be transferred is at a low level, the voltage of the bus DBUS is kept at a low level.

At the start of data input from the bus DBUS to the data latch circuit XDL, the data latch circuit XDL is in the state shown in FIG. 10. The sequencer 25 operates the data latch circuit XDL as shown in FIG. 11 when data is input from the bus DBUS to the data latch circuit XDL.

Figure 11:
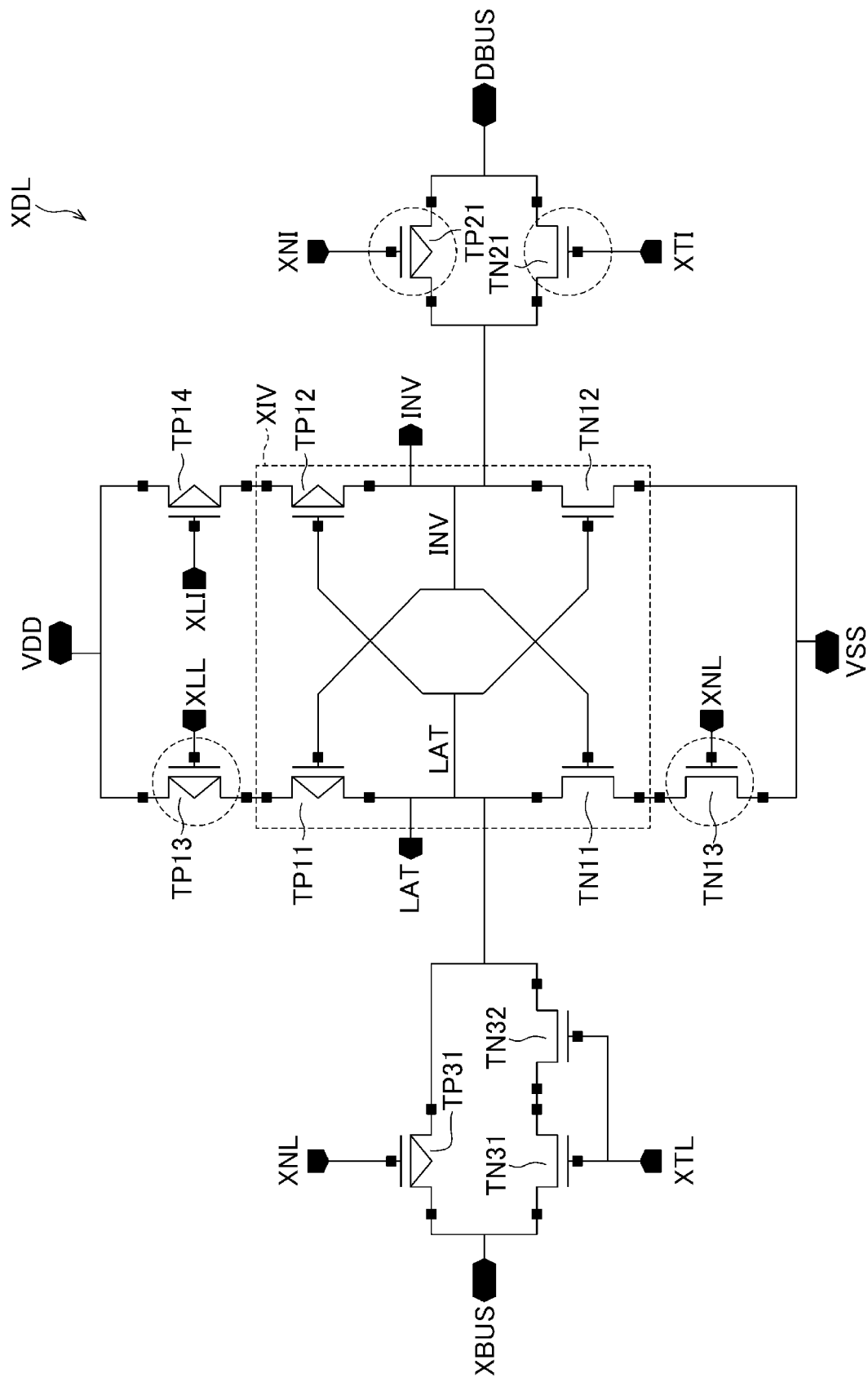
FIG. 11 is a circuit diagram showing the operation example of the data latch circuit according to the embodiment.

As shown in FIG. 11, the sequencer 25 keeps the transistors TP31, TN31, and TN32 in the OFF state by keeping the control signal XNL at a high level and the control signal XTL at a low level. Therefore, the node LAT is disconnected from the bus XBUS.

Further, the sequencer 25 keeps the transistor TP13 in the ON state by keeping the control signal XLL at a low level. Further, the sequencer 25 keeps the transistor TP14 in the OFF state by keeping the control signal XLI at a high level.

In this state, the sequencer 25 keeps the transistors TP21 and TN21 in the ON state by keeping the control signal XNI at a low level and the control signal XTI at a high level. As a result, the node INV is connected to the bus DBUS, the level of the node INV goes into the level of the bus DBUS, and the level of the node LAT goes into the level opposite to the level of the bus DBUS. That is, if the voltage of the bus DBUS is at a high level, the voltage of the node INV is at a high level, while the level of the node LAT is at a low level. In this way, the data at the high level of the bus DBUS is transferred to the data latch circuit XDL. On the other hand, if the voltage of the bus DBUS is at a low level, the voltage of the node INV is at a low level, while the level of the node LAT is at a high level. In this way, the data at the low level of the bus DBUS is transferred to the data latch circuit XDL.

Data Output to Bus XBUS

At the start of data output to the bus XBUS, the data latch circuit XDL is in the state shown in FIG. 10. When outputting data from the data latch circuit XDL to the bus XBUS, the sequencer 25 operates the data latch circuit XDL as shown in FIG. 12.

Figure 12:
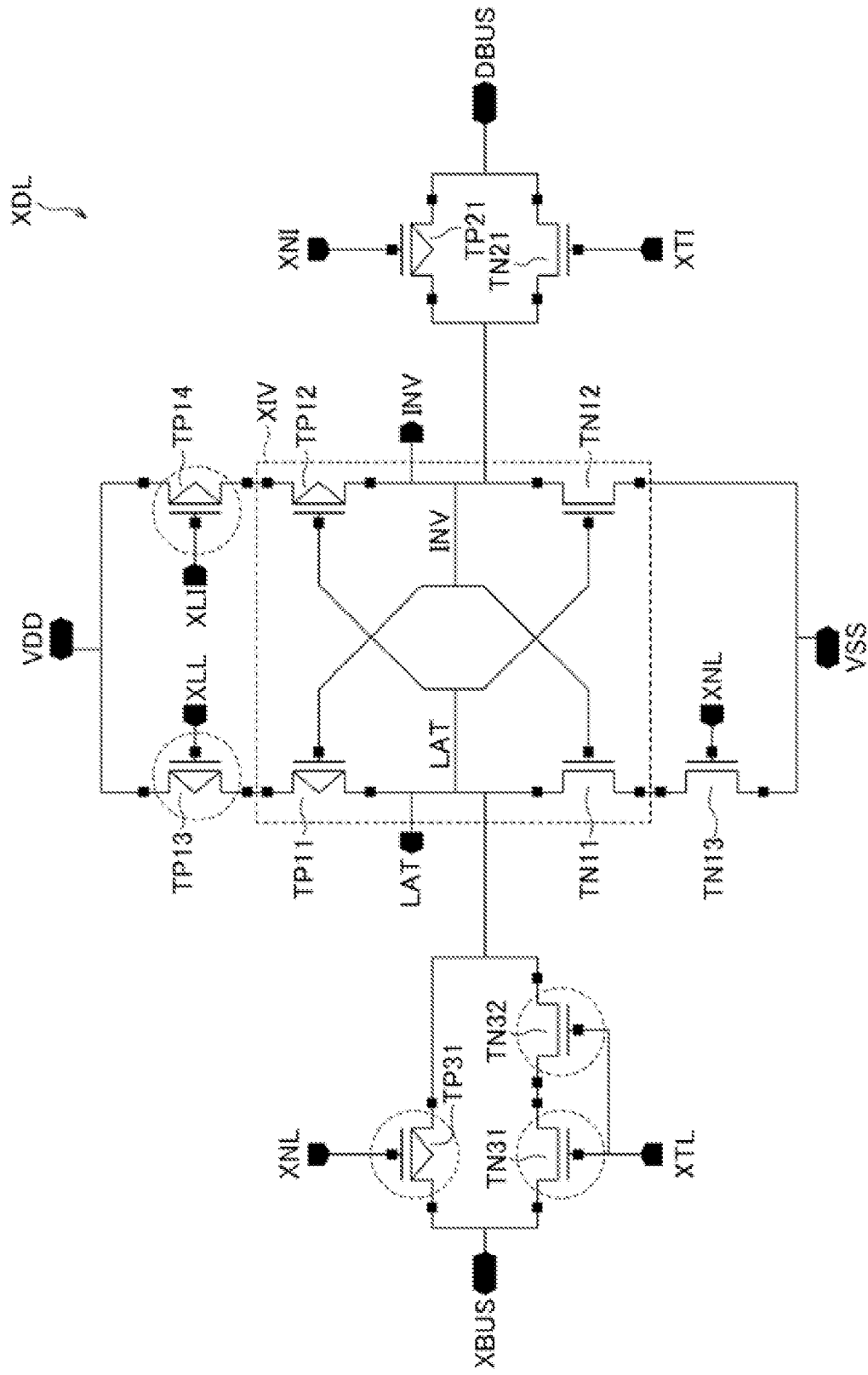
FIG. 12 is a circuit diagram showing the operation example of the data latch circuit according to the embodiment.

As shown in FIG. 12, the sequencer 25 keeps the transistors TP21, TN21 in the OFF state by keeping the control signal XNI at a high level and the control signal XTI at a low level. Therefore, the node INV is disconnected from the bus DBUS.

Further, the sequencer 25 keeps the transistors TP13, TP14, and TP31 in the ON state by keeping the control signals XLL, XLI and XNL at a low level.

In this state, the sequencer 25 keeps the transistors TN31 and TN32 in the ON state by setting the control signal XTL to the ON state. Since the control signal XNL input to the gate of the transistor TP31 is set to a low level as described above, the transistor TP31 is also kept in the ON state. As a result, the node LAT is connected to the bus XBUS, and the level of the node LAT is output to the bus XBUS. That is, if the voltage of the node LAT is at a high level, the voltage of the bus XBUS is kept at a high level, and the data at the high level is transferred from the data latch circuit XDL to the bus XBUS. On the other hand, if the voltage of the node LAT is at a low level, the voltage of the bus XBUS is kept at a low level, and the data at the low level is transferred from the data latch circuit XDL to the bus XBUS.

Data input from Bus XBUS

Figure 13:
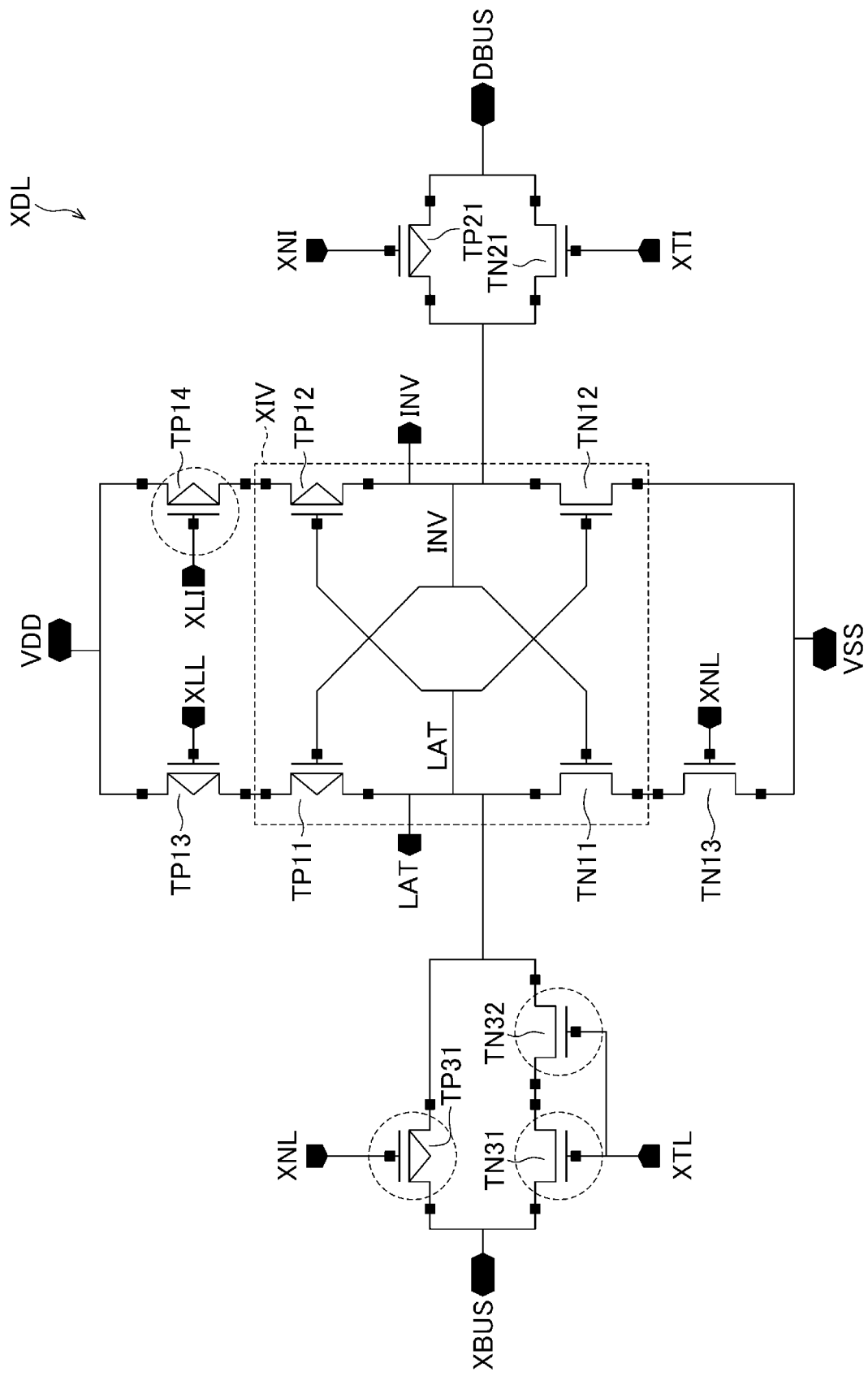
FIG. 13 is a circuit diagram showing the operation example of the data latch circuit according to the embodiment.

At the start of data input from the bus XBUS, the data latch circuit XDL is in the state shown in FIG. 10. When data is input from the bus XBUS to the data latch circuit XDL, the sequencer 25 operates the data latch circuit XDL as shown in FIG. 13. Since the operation of the data latch circuit XDL at this time is the same as the operation when data is input from the above-mentioned bus DBUS to the data latch circuit DL except only that the input side is switched to the bus XBUS, and the basic operation is the same, the detailed explanation is omitted.

Data Output to Bus DBUS

Figure 14:
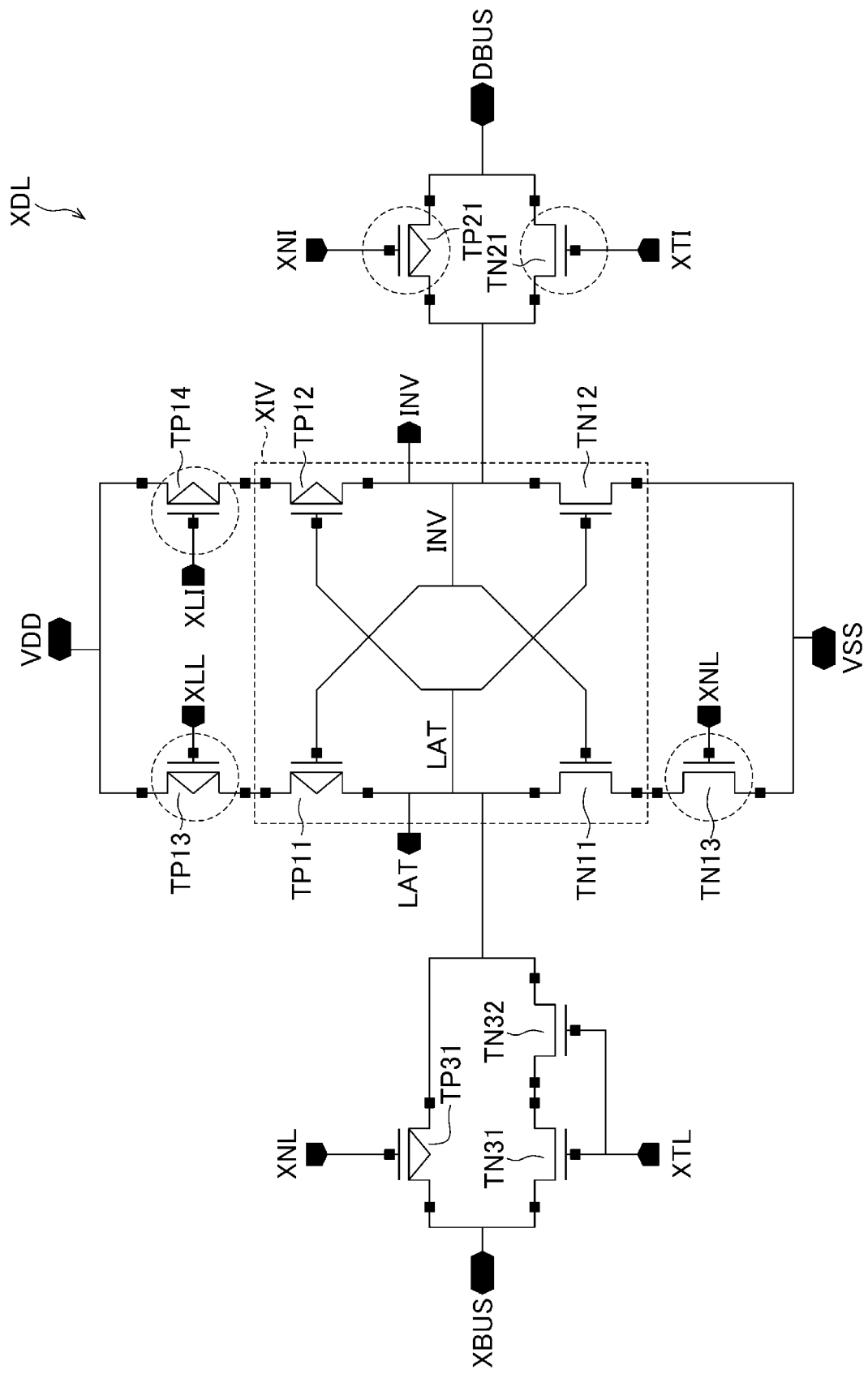
FIG. 14 is a circuit diagram showing the operation example of the data latch circuit according to the embodiment.

At the start of data output to the bus DBUS, the data latch circuit XDL is in the state shown in FIG. 10. When the sequencer 25 outputs data from the data latch circuit XDL to the bus DBUS, the sequencer 25 operates the data latch circuit XDL as shown in FIG. 14. Since the operation of the data latch circuit XDL at this time is the same as the operation when the data is output from the above-mentioned data latch circuit XDL to the bus XBUS except only that the output destination is switched to the bus DBUS, and the basic operation is the same, the detailed description is omitted.

Advantageous Effect of Data Latch Circuit XDL of Present Embodiment

The data latch circuit XDL of the present embodiment shown in FIGS. 6, 8A and 8B has two transistors TN31 and TN32 respectively provided with single vias VN31 and VN32. In addition, the data latch circuit XDL of FIGS. 9 and 15 has two vias VN31 and VN32 on the single transistor TN31. If the data latch circuit XDL neither has a double gate structure of the transistors TN31 and TN32 nor a double via structure of the transistor TN31, that is, if the data latch circuit XDL only has a transistor TN31 and only one via is provided thereon, when an open failure occurs in the via connected to the gate of the transistor TN31 or the wiring connected to the via, not only the operation of the data latch circuit XDL becomes unstable, but also the sense amplifier unit SAU including the failed data latch circuit XDL and other sense amplifier units SAU connected to the data latch circuit XDL via the bus XBUS may become unusable.

Specifically, when manufacturing the semiconductor memory device 2 as shown in FIG. 7, in the process of connecting the via to the gate of the transistor TN31 and the process of connecting the wiring to the via, an open failure may occur in the via or the wiring. If an open failure occurs in the via or wiring connected to the gate, the gate of the transistor TN31 floats and the gate voltage cannot be controlled. In this case, since the gate voltage of the transistor TN31 is determined by charge sharing from the adjacent signal transmitted in the vicinity of the transistor TN31, the gate voltage of the transistor TN31 becomes unstable. Since the situation of the adjacent signal changes each time, it is not possible to control the ON/OFF of the transistor TN31 as a result.

When the data latch circuit XDL is in the state of latching the data, the transistor TN13 should be normally kept in the OFF state. However, when the ON/OFF of the transistor TN13 cannot be controlled as described above, a so-called ON failure may occur in which the transistor TN13 is turned to be the ON state at an unexpected timing even when the data is latched. On the other hand, when the data is latched, since the control signal XNL is set to a high level in order to turn the transistor TP31 to be the OFF state, the transistor TN13 is set to the ON state. Therefore, if the transistor TN13 is turned to be the ON state at an unexpected timing, the bus XBUS may be connected to the ground voltage node VSS. That is, the bus XBUS connected to the data latch circuit XDL having the transistor TN13 in which an ON failure has occurred may transition to the ground voltage at an unexpected timing.

As shown in FIG. 5, for example, the data latch circuits XDL0 of the plurality of sense amplifier units SAU are connected to the common bus XBUS. Therefore, when the ON failure of the transistor TN13 occurs in the data latch circuit XDL0 of one sense amplifier unit SAU of the plurality of sense amplifier units SAU, and when trying to transfer data from another data latch circuit XDL0 in which an ON failure has not occurred to the bus XBUS, the bus XBUS may be transitioned to the ground voltage, and data may not be transferred properly. As a result, not only the data latch circuit XDL in which the transistor TN13 has an ON failure, but also all the data latch circuits XDL sharing the bus XBUS with the data latch circuit XDL cannot be used.

Further, since all the sense amplifier circuits SAC0 to SAC(m−1) sharing the bus DBUS with a certain data latch circuit XDL are controlled as one unit, due to the unstable operation of the data latch circuit XDL having the transistor TN13 in which an ON failure has occurred, all the sense amplifier circuits SAC0 to SAC(m−1) sharing the bus DBUS with the data latch circuit XDL may not be used either.

In this respect, the data latch circuit XDL of the present embodiment has two transistors TN31 and TN32 as transistors corresponding to the control signal XTL, as shown in FIGS. 6, 8A and 8B, and the data latch circuit XDL of the variation of the present embodiment has two vias VN31 and VN32 on a transistor TN31, as shown in FIGS. 9 and 15. According to this configuration, even when an ON failure occurs in one transistor TN31 (or one VN31), as long as the other transistor TN32 (or the other via VN32) is normal, the bus XBUS does not transition to the ground voltage at an unexpected timing. That is, even if an ON failure occurs in either one of the transistors TN31 and TN32, the operation of the data latch circuit XDL can be secured by the other transistor that is normal. Therefore, it is possible to improve the robustness of input and output of data.

First Modification Example

As a method of connecting the wiring to the via V31 of the transistor TN31 and the via V32 of the transistor TN32, a method different from the method shown in FIGS. 8A and 8B may also be used.

Figure 16:
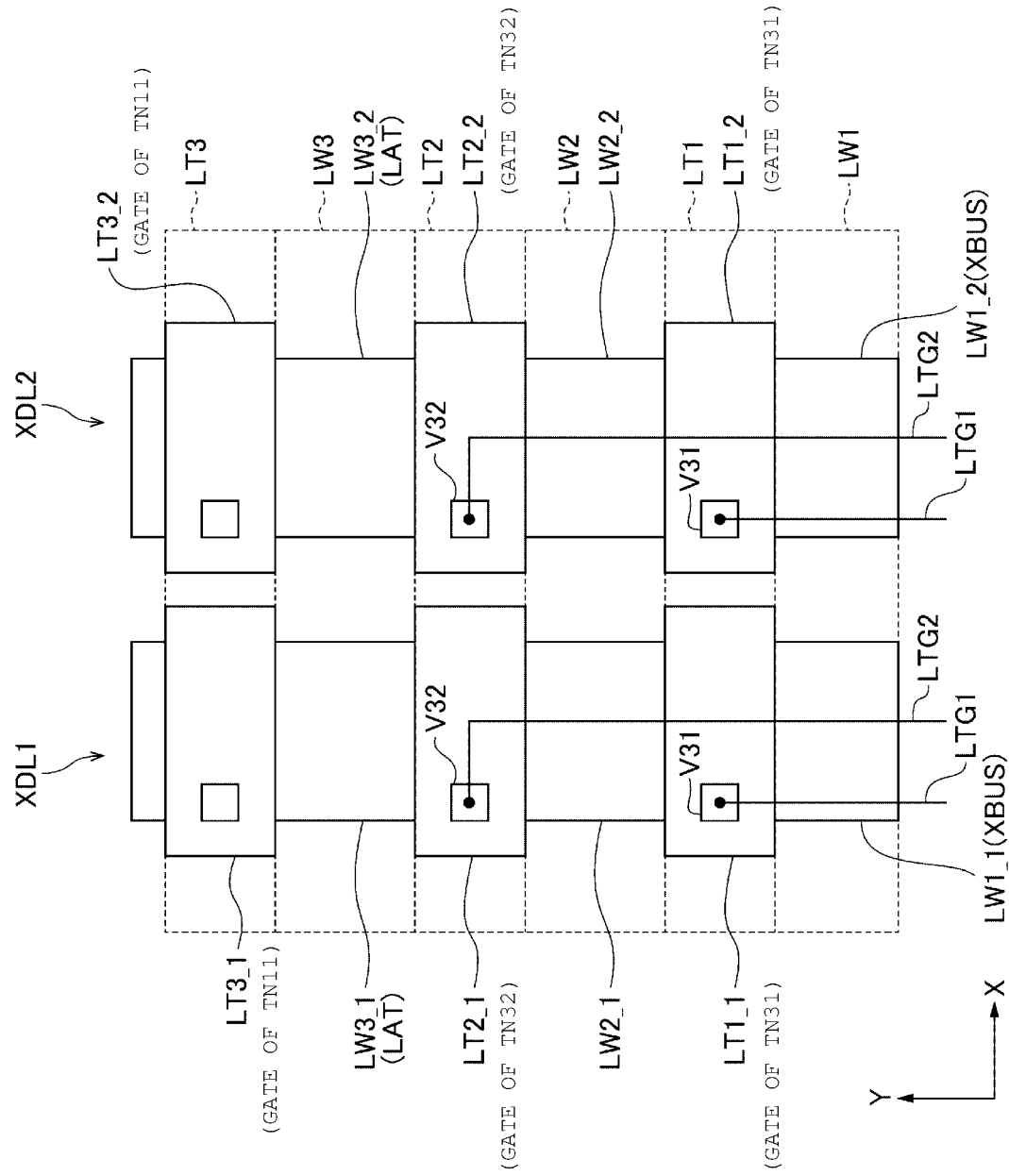
FIG. 16 is a diagram schematically showing a planar structure around a data latch circuit of a semiconductor memory device according to a first modification example.

For example, as shown in FIG. 16, different wirings LTG1 and LTG2 may be connected to the via V31 of the transistor TN31 and the via V32 of the transistor TN32, respectively. In this configuration, the control signal XTL is independently input from the sequencer 25 to each of the wirings LTG1 and LTG2. In the other words, an arrangement shown in FIG. 16 is similar to an arrangement shown in FIG. 8A except that different wirings are connected to the vias, respectively, instead of a common wiring.

Figure 17:
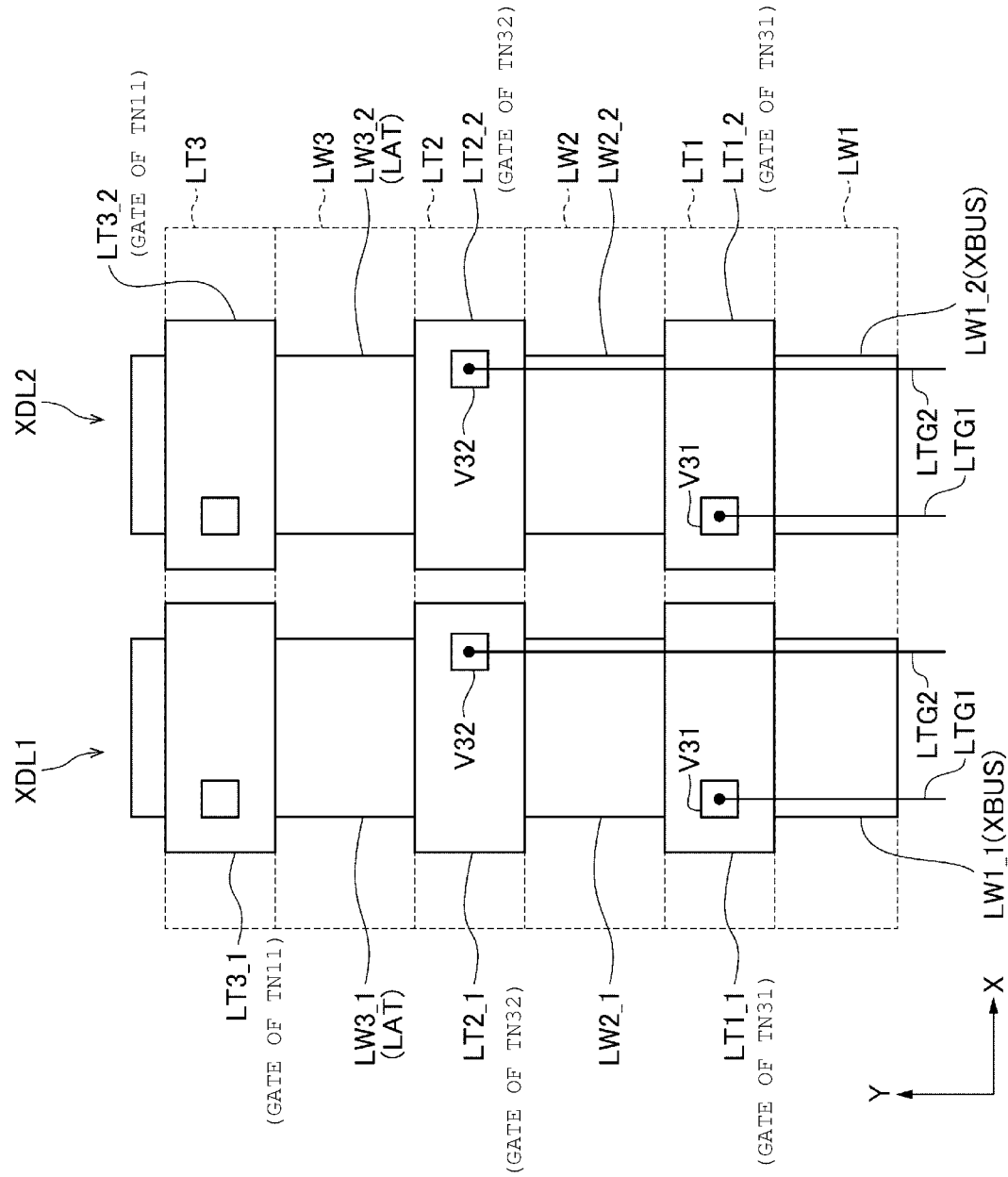
FIG. 17 is a diagram schematically showing a planar structure around the data latch circuit of the semiconductor memory device according to the first modification example.

Alternatively, as shown in FIG. 17, the via V31 of the transistor TN31 and the via V32 of the transistor TN32 may be disposed so as not to overlap each other in the depth direction Y. In this configuration, when the wirings LTG1 and LTG2 are connected to the via V31 of the transistor TN31 and the via V32 of the transistor TN32, the wirings LTG1 and LTG2 do not overlap with each other. Therefore, as shown in FIG. 16, it is not necessary to bend either one of the wirings LTG1 and LTG2. In the present modification example, the wirings LTG1 and LTG2 are different signal lines. In the other words, an arrangement shown in FIG. 17 is similar to an arrangement shown in FIG. 8B except different wirings are connected to the vias, respectively, instead of a common wiring.

According to the present modification example, even when an open circuit failure occurs on one of the wirings LTG1 and LTG2 to cause unintentional ON failure in one of the transistors TN31 and TN32, the remaining one of the transistors TN31 and TN32 can be turned off by supplying an appropriate control signal from the sequencer 25 via the remaining one of the wirings LTG1 and LTG2.

Second Modification Example

Figure 18:
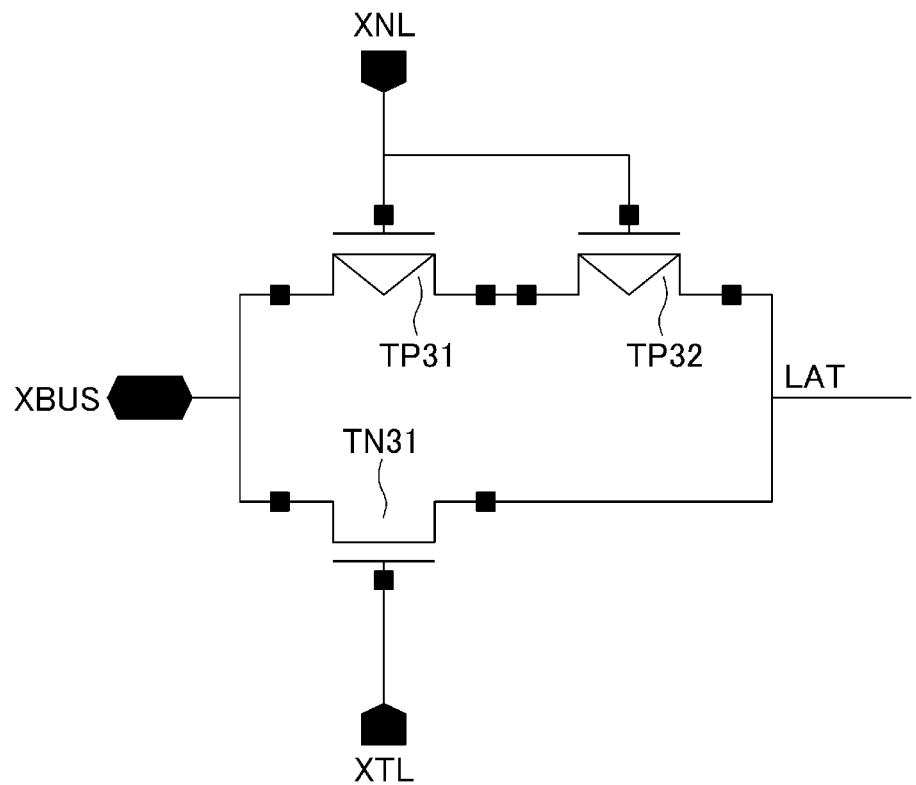
FIG. 18 is a circuit diagram showing a part of a configuration of a data latch circuit according to a second modification example.

The data latch circuit XDL of the present modification example has the configuration shown in FIG. 18. As shown in FIG. 18, in this data latch circuit XDL, between the bus XBUS and the node LAT, two transistors TP31 and TP32, which are P-channel type MOS transistors, and a transistor TN31, which is an N-channel type MOS transistor, are connected. The transistors TP31 and TP32 are connected in series. The transistor TN31 is connected in parallel to the transistors TP31 and TP32 connected in series. According to this configuration, even when one of the transistors TP31 and TP32 fails, the operation of the data latch circuit XDL can be secured by the other transistor that is normal.

Figure 19:
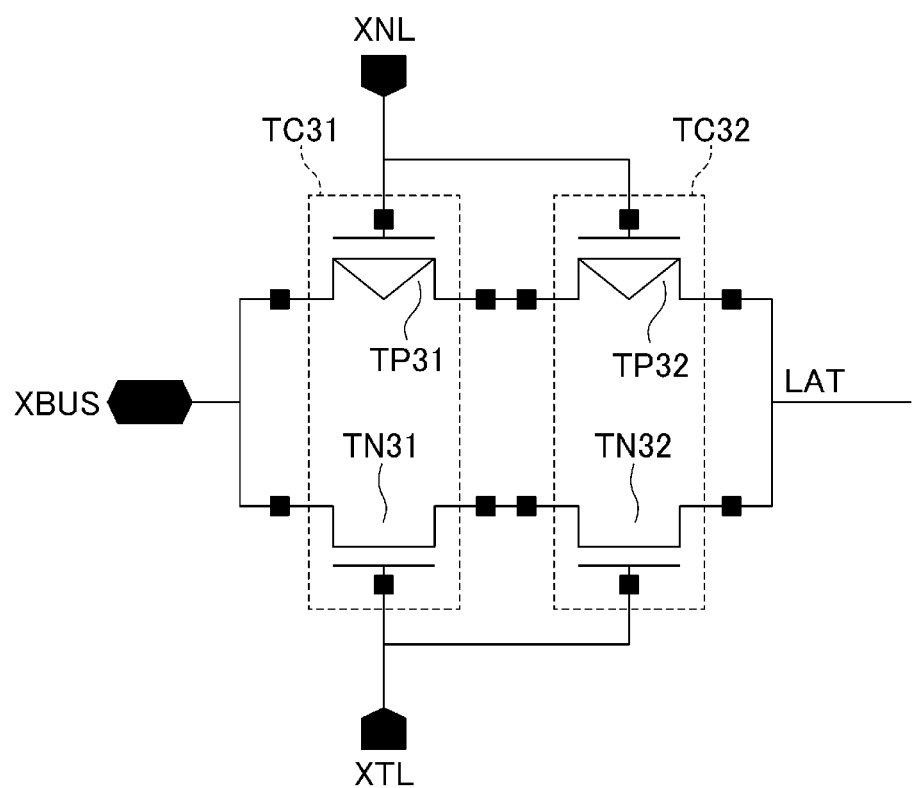
FIG. 19 is a circuit diagram showing a part of the configuration of the data latch circuit according to the second modification example.

Alternatively, the data latch circuit XDL may have the configuration shown in FIG. 19. As shown in FIG. 19, in this data latch circuit XDL, two transistors TC31 and TC32, which form complementary transfer gates, are connected between the bus XBUS and the node LAT. The transistor TC31 has the N-channel type MOS transistor TN31 and the P-channel type MOS transistor TP31. Similarly, the transistor TC32 has the N-channel type MOS transistor TN32 and the P-channel type MOS transistor TP32. The N-channel type MOS transistors TN31 and TN32 are connected in series. The P-channel type MOS transistors TP31 and TP32 are also connected in series.

According to this configuration, even when one of the transistors TC31 and TC32 fails, the operation of the data latch circuit XDL can be secured by the other transistor that is not defective.

Third Modification Example

Figure 20:
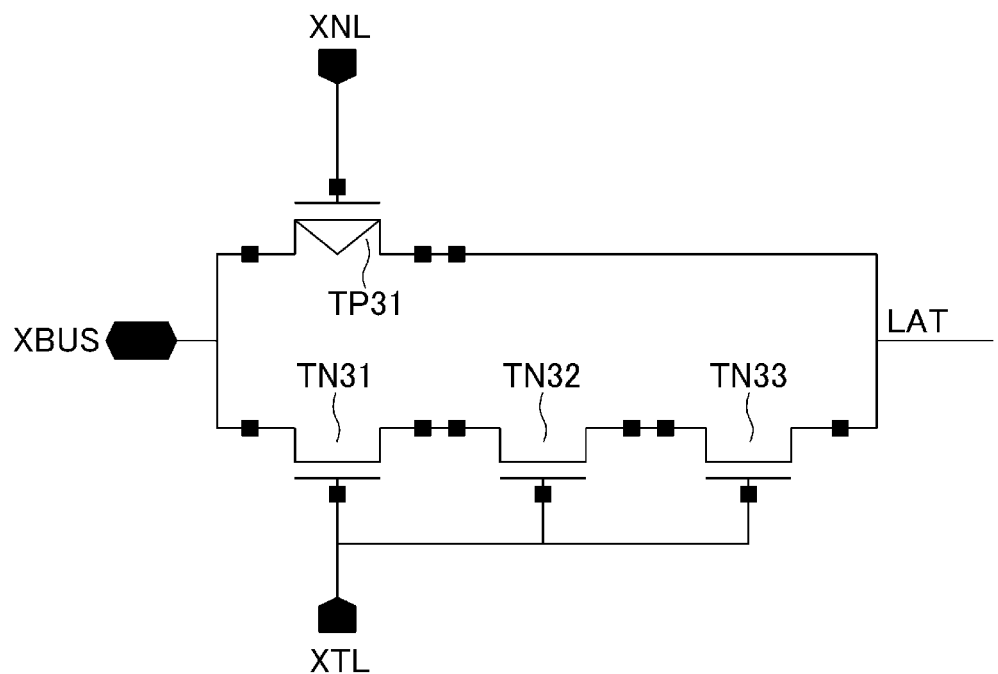
FIG. 20 is a circuit diagram showing a part of a configuration of a data latch circuit according to a third modification example.

As shown in FIG. 20, in the data latch circuit XDL of the present modification example, the transistor TN33, which is an N-channel type transistor, is further connected in series to the transistors TN31 and TN32. According to this configuration, even when one or two of the three transistors TN31, TN32, and TN33 fail, the operation of the data latch circuit XDL can be secured by the remaining transistors.

The N-channel type MOS transistor may be multiplexed by a number of three or more. Further, instead of the N-channel type MOS transistor, the P-channel type MOS transistor may be multiplexed by a number of three or more.

Fourth Modification Example

Figure 21:
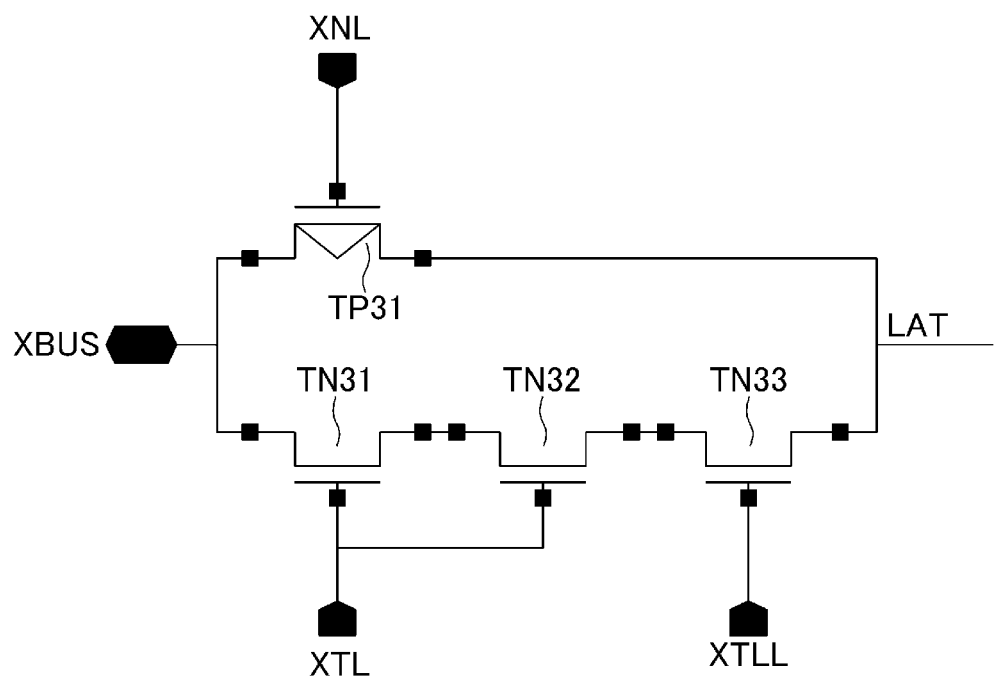
FIG. 21 is a circuit diagram showing a part of a configuration of a data latch circuit according to a fourth modification example.

The data latch circuit XDL of the present modification example has the configuration shown in FIG. 21. As shown in FIG. 21, in this data latch circuit XDL, three transistors TN31, TN32, and TN33, which are N-channel type transistors, are connected in series. The control signal XTL is input to the gates of the transistors TN31 and TN32. A control signal XTLL different from the control signal XTL is input to the gate of the transistor TN32. In the present modification example, the transistors TN31, TN32, and TN33 correspond to a multiplexed transistor, the transistors TN31 and TN32 correspond to a first transistor, and the transistor TN33 corresponds to a second transistor. Further, the control signal XTL corresponds to a first signal, and the control signal XTLL corresponds to a second signal.

By the way, when the semiconductor memory device 2 has a structure as shown in FIGS. 8A and 8B, for example, when an open failure occurs in an intermediate portion P1 of the wiring LTG, the gates of the transistors TN31 and TN32 may float. In this case, even if the redundant transistors TN31 and TN32 are provided, an ON failure may occur in both the transistors TN31 and TN32.

In this regard, with the configuration shown in FIG. 21, even if an on failure occurs in both the transistors TN31 and TN32, the operation of the data latch circuit XDL can be secured by controlling the ON/OFF of the transistor TN33 by the control signal XTLL. Therefore, the robustness of input and output of data can be further improved.

Figure 22:
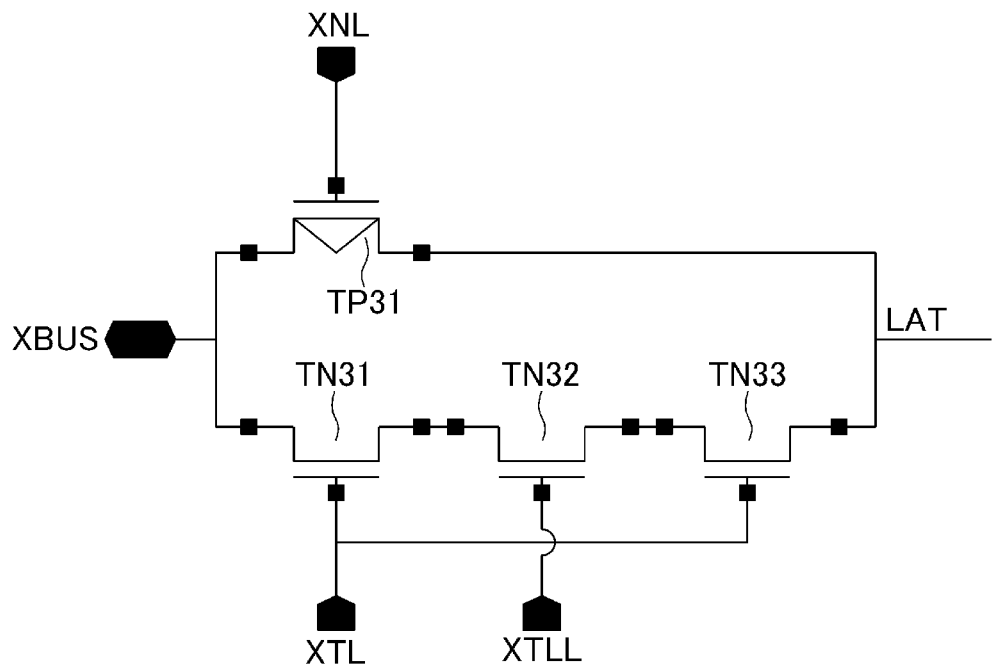
FIG. 22 is a circuit diagram showing a part of the configuration of the data latch circuit according to the fourth modification example.

The data latch circuit XDL may have the configuration shown in FIG. 22. As shown in FIG. 22, in this data latch circuit XDL, the control signal XTL is input to the gates of the transistors TN31 and TN33, and another control signal XTLL is input to the gate of the transistor TN32. In the present modification example, the transistors TN31 and TN33 correspond to the first transistor, and the transistor TN32 corresponds to the second transistor.

Figure 23:
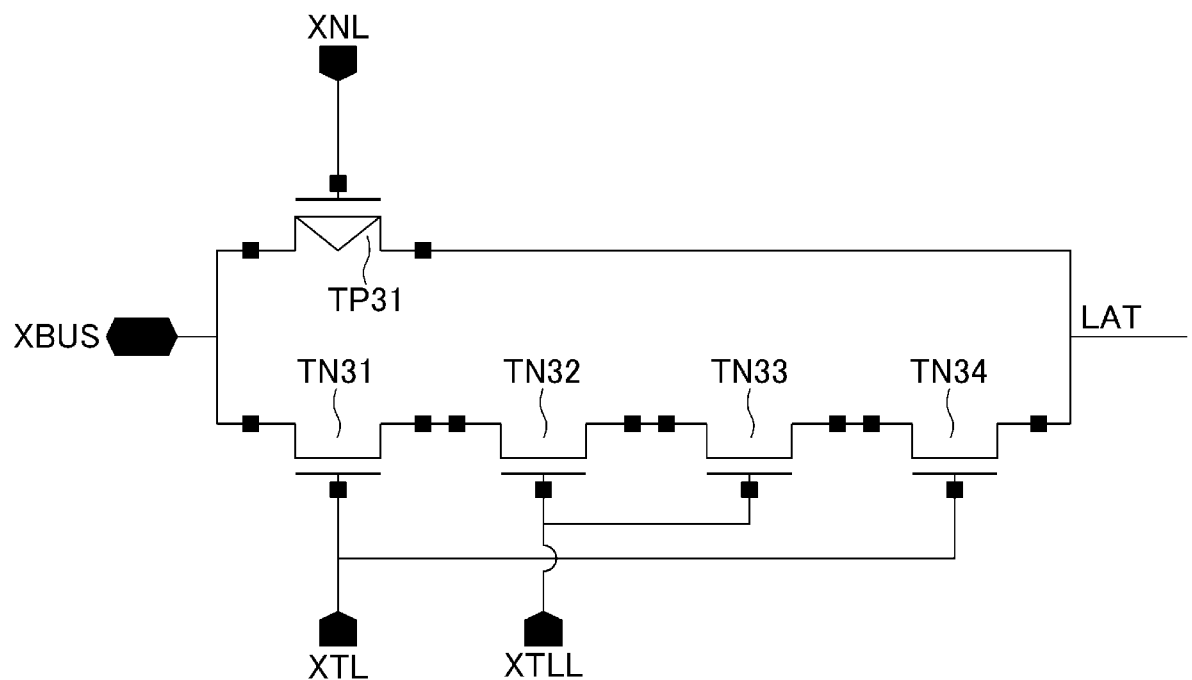
FIG. 23 is a circuit diagram showing a part of the configuration of the data latch circuit of the fourth modification example.

Alternatively, the data latch circuit XDL may have the configuration shown in FIG. 23. As shown in FIG. 23, in this data latch circuit XDL, four transistors TN31, TN32, TN33, and TN34 are connected in series. The control signal XTL is input to the gates of the transistors TN31 and TN34, and another control signal XTLL is input to the gates of the transistors TN32 and TN33. In the present modification example, the transistors TN31 and TN34 correspond to the first transistor, and the transistors TN32 and TN33 correspond to the second transistor.

Even with the configuration shown in FIGS. 22 and 23, it is possible to obtain the same or similar operation and effect as the configuration shown in FIG. 21.

Other Embodiments

The present disclosure is not specifically limited to the above.

As shown in FIGS. 6 and 18 to 23, in the semiconductor memory device 2, at least one of an N-channel type MOS transistor and a P-channel type MOS transistor disposed between the bus XBUS and the node LAT may be multiplexed.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
a plurality of data latch circuits that are used for input and output of data between a sense amplifier circuit and an input/output circuit; and
a data wiring that is connected to the plurality of data latch circuits, wherein
each of the data latch circuits includes
a data storage unit that temporarily stores data input and output between the sense amplifier circuit and the input/output circuit, and
at least two N-channel type MOS transistors and at least one P-channel type MOS transistor provided between the data storage unit and the data wiring, and
a common signal line is connected to gates of the at least two N-channel type MOS transistors.

2. The semiconductor memory device according to claim 1, wherein the at least one P-channel type MOS transistor provided between the data storage unit and the data wiring includes two P-channel type MOS transistors.

3. The semiconductor memory device according to claim 2, wherein one of the at least two N-channel type MOS transistors and one of the two P-channel type MOS transistors form a first complementary transfer gate and another one of the at least two N-channel type MOS transistors and another one of the two P-channel type MOS transistors form a second complementary transfer gate that is connected in series with the first complementary transfer gate between the data storage unit and the data wiring.

4. The semiconductor memory device according to claim 3, wherein
a common signal line is connected to gates of the two P-channel type MOS transistors of the first and second complementary transfer gates.

5. The semiconductor memory device according to claim 1, wherein the at least two N-channel type MOS transistors provided between the data storage unit and the data wiring include three or more N-channel type MOS transistors.

6. The semiconductor memory device according to claim 5, wherein
the common signal line is connected to gates of the three or more N-channel type MOS transistors.

7. The semiconductor memory device according to claim 5, wherein
at least two different signal lines are connected to gates of the three or more N-channel type MOS transistors.

8. The semiconductor memory device according to claim 7, wherein
the three or more N-channel type MOS transistors include a first N-channel type MOS transistor, a second N-channel type MOS transistor, and at least one middle N-channel type MOS transistor between the first and second N-channel type MOS transistors, and
the at least two different signal lines include the common signal line connected to gates of the first and at least one middle N-channel type MOS transistors and a signal line connected to the second N-channel type MOS transistor.

9. The semiconductor memory device according to claim 7, wherein
the three or more N-channel type MOS transistors include a first N-channel type MOS transistor, a second N-channel type MOS transistor, and at least one middle N-channel type MOS transistor between the first and second N-channel type MOS transistors, and
the at least two different signal lines include the common signal line connected to gates of the first and second N-channel type MOS transistors and a signal line connected to one or more gates of the at least one middle N-channel type MOS transistor.

10. The semiconductor memory device according to claim 1, wherein the vias are aligned in the first direction and extend in a second direction perpendicular to the first direction.

11. The semiconductor memory device according to claim 1, wherein the vias extend in a second direction perpendicular to the first direction and are offset in a third direction perpendicular to the first and second directions.

12. A semiconductor memory device comprising:
a plurality of data latch circuits that are used for input and output of data between a sense amplifier circuit and an input/output circuit; and
a data wiring that is connected to the plurality of data latch circuits, wherein
each of the data latch circuits includes
a data storage unit that temporarily stores data input and output between the sense amplifier circuit and the input/output circuit, and
at least one N-channel type MOS transistor and at least two P-channel type MOS transistors provided between the data storage unit and the data wiring, and
a common signal line is connected to gates of the at least two P-channel type MOS transistors.

13. The semiconductor memory device according to claim 12, wherein the at least one N-channel type MOS transistor provided between the data storage unit and the data wiring includes two or more N-channel type MOS transistors.

14. A semiconductor memory device comprising:
a plurality of data latch circuits that are used for input and output of data between a sense amplifier circuit and an input/output circuit;
a first data wiring that is connected between the sense amplifier circuit and the plurality of data latch circuits; and second data wirings, each of which is connected between one of the data latch circuits and the input/output circuit, wherein each of the data latch circuits includes
- a data storage unit that temporarily stores data input and output between the sense amplifier circuit and the input/output circuit, and
- at least two N-channel type MOS transistors and at least one P-channel type MOS transistor provided between the data storage unit and a corresponding one of the second data wirings, and
- a common signal line is connected to gates of the at least two N-channel type MOS transistors.

15. The semiconductor memory device according to claim 14, wherein the at least one P-channel type MOS transistor provided between the data storage unit and the corresponding one of the second data wirings includes two P-channel type MOS transistors.

16. The semiconductor memory device according to claim 15, wherein one of the at least two N-channel type MOS transistors and one of the two P-channel type MOS transistors form a first complementary transfer gate and another one of the at least two N-channel type MOS transistors and another one of the two P-channel type MOS transistors form a second complementary transfer gate that is connected in series with the first complementary transfer gate between the data storage unit and the corresponding one of the second data wirings.

17. The semiconductor memory device according to claim 16, wherein
- a common signal line is connected to gates of the two P-channel type MOS transistors of the first and second complementary transfer gates.

18. The semiconductor memory device according to claim 14, wherein the at least two N-channel type MOS transistors provided between the data storage unit and the corresponding one of the second data wirings include three or more N-channel type MOS transistors.

19. The semiconductor memory device according to claim 14, wherein the at least two N-channel type MOS transistors provided between the data storage unit and the corresponding one of the second data wirings include three or more N-channel type MOS transistors.

20. The semiconductor memory device according to claim 19, wherein
- the common signal line is connected to gates of the three or more N-channel type MOS transistors.

* * * * *